United States Patent
Apostolos et al.

(10) Patent No.: US 8,463,557 B2
(45) Date of Patent: Jun. 11, 2013

(54) METHOD AND SYSTEM FOR THE DETECTION AND IDENTIFICATION OF EXPLOSIVES AND/OR CONTRABAND

(75) Inventors: John T. Apostolos, Lyndeborough, NH (US); Paul A. Zank, Brookline, NH (US); Judy Feng, Nashua, NH (US); Candice L. Brittain, Nashua, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 223 days.

(21) Appl. No.: 12/957,948

(22) Filed: Dec. 1, 2010

(65) Prior Publication Data

US 2012/0136585 A1     May 31, 2012

Related U.S. Application Data

(60) Provisional application No. 61/305,762, filed on Feb. 18, 2010.

(51) Int. Cl.
*G01N 31/00* (2006.01)
*G01V 3/00* (2006.01)

(52) U.S. Cl.
USPC .................................... 702/23; 324/307

(58) Field of Classification Search
USPC ............. 702/23, 22, 27–30, 32, 40, 66–67, 702/70–71, 73, 75–77, 79, 81, 84–85, 106, 702/127, 134–135, 188–189; 324/307–310, 324/312–313, 315, 317
See application file for complete search history.

(56) References Cited

U.S. PATENT DOCUMENTS

| | | | |
|---|---|---|---|
| 4,513,292 A | 4/1985 | Bowman |
| 5,206,592 A | 4/1993 | Buess et al. |
| 5,539,412 A | 7/1996 | Mendelson |
| 5,608,321 A | 3/1997 | Garroway et al. |
| 6,046,586 A | 4/2000 | Rinard |
| 6,166,541 A | 12/2000 | Smith et al. |
| 6,411,835 B1 | 6/2002 | Modell et al. |
| 6,900,633 B2 | 5/2005 | Sauer et al. |
| 7,119,682 B1 | 10/2006 | Fisher |
| 7,170,288 B2 | 1/2007 | Fullerton |
| 7,345,478 B2 | 3/2008 | Lieblich et al. |
| 7,352,180 B2 | 4/2008 | Manneschi |
| 7,417,440 B2 | 8/2008 | Peschmann et al. |
| 7,471,744 B2 | 12/2008 | Van Wechel et al. |
| 7,511,496 B2 | 3/2009 | Schiano |
| 7,595,638 B2 | 9/2009 | Crowley |
| 7,768,262 B2 | 8/2010 | Schiano |
| 7,888,646 B2 | 2/2011 | Breit et al. |
| 2004/0138838 A1 | 7/2004 | Scheiner et al. |

(Continued)

OTHER PUBLICATIONS

Fisher et al., A Versatile Computer-Controlled Pulsed Nuclear Quadrupole Resonance Spectrometer, Dec. 1999, Review of Scientific Instruments, vol. 70, No. 12, pp. 4676-4681.*

*Primary Examiner* — Toan Le
(74) *Attorney, Agent, or Firm* — Robert K. Tendler; Daniel J. Long

(57) ABSTRACT

A nuclear quadrupole resonance system which senses the stimulated emission from target molecules includes a calibration step and a stimulated emission response detection step, with the system employing clutter cancellation involving linear regression and the use of cross correlation with a series of known molecular signatures, both increasing the signal-to-noise ratio of the system.

19 Claims, 19 Drawing Sheets

U.S. PATENT DOCUMENTS

| | | |
|---|---|---|
| 2004/0150550 A1 | 8/2004 | Shouno et al. |
| 2005/0059355 A1 | 3/2005 | Liu |
| 2005/0128069 A1* | 6/2005 | Skatter ............ 340/522 |
| 2005/0241639 A1 | 11/2005 | Zilberg |
| 2006/0012371 A1 | 1/2006 | Laubacher et al. |
| 2006/0122484 A1 | 6/2006 | Itozaki et al. |
| 2007/0153974 A1 | 7/2007 | Smith |
| 2008/0036462 A1 | 2/2008 | Schiano |
| 2008/0309339 A1 | 12/2008 | Chisholm et al. |
| 2009/0046538 A1 | 2/2009 | Breed et al. |
| 2009/0085565 A1 | 4/2009 | Fullerton |
| 2010/0212401 A1 | 8/2010 | Crowley et al. |

* cited by examiner

METHOD AND SYSTEM FOR THE DETECTION AND IDENTIFICATION OF EXPLOSIVES AND/OR CONTRABAND

RELATED APPLICATIONS

This application claims rights under 35 USC. §119(e) from U.S. Application Ser. No. 61/305,762 filed Feb. 18, 2010, the contents of which are incorporated herein by reference.

FIELD OF THE INVENTION

This invention relates to detection and identification of explosives and contraband utilizing Nuclear Quadrupole Resonance (NQR) and more particularly to the improvement in the robustness of the detection of such molecules when utilizing NQR through the use of clutter cancellation involving the use of linear regression and also the use of cross correlation to increase signal-to-noise ratios.

BACKGROUND OF THE INVENTION

As discussed in the co-pending patent application corresponding to Provisional Patent Application Ser. No. 61/299,652, filed Jan. 29, 2010 as signed to the assignee hereof and incorporated herein by reference, a nuclear quadrupole resonance detection system is described in which signals having energy corresponding to expected spectral lines for a target molecule are transmitted down a balanced terminated transmission line. This has been found to produce stimulated emissions for any target molecules within the transmission line, with the stimulated emissions detected utilizing a directional coupler in one embodiment.

As described in the above patent application, it is only with difficulty that one can detect molecules when for instance injecting energy in the 0.1-5 MHz range to cause the stimulated emission. It has been found however that such a stimulated emission does occur and is recognizable such that utilizing the above basic NQR techniques and a network analyzer one can detect the signature of the stimulated emission response in terms of the S21 response of the analyzer.

In order to be able to detect the stimulated emission response and more particularly to be able to distinguish it from background clutter, in one embodiment of the basic NQR system one monitors the balanced transmission line without any material therein, thus to provide a reference level for the transmission line. One then operates the system to detect any target molecules within the confines of the transmission line by comparing the S21 ratio from the network analyzer, with the self-same S21 ratio obtained when none of the target molecules exist within the transmission line.

While such stimulated emissions have been found, it is important to be able to distinguish the stimulated emission peaks or spectral lines in the presence of clutter and more particularly to be able to do a comparison between the empty transmission line and one in which target molecules are present.

This comparison is not necessarily straight forward due to the fact for instance that the molecules when they are packaged or carried on a person have an associated stimulated emission response that contains a dielectric component. This dielectric component alters the shape of the stimulated response curve such that the reference when subtracted from the detected signal does not yield exact cancellation of environmental clutter. This permits ready isolation of the spectral line.

Aside from the dielectric component surrounding the molecules in question, there is also the problem of finding a peak or spectral line that is some 70 to 80 dB down and embedded in noise. The noise level in this case refers to clutter components and in such systems the clutter noise level may be as high as at −10 dB.

On the other hand, the spike or spectral line that is sought to be detected may be buried in this noise and may be some 80 dB down, meaning that the detectable signal is more than 70 dB below the noise level.

The question then becomes how to robustly identify spectral lines that are buried so far beneath the clutter.

SUMMARY OF INVENTION

In order to robustly detect or identify spectral lines in the basic NQR system, one utilizes a clutter cancellation technique which involves the use of linear regression or least square fit to characterize a reference level and signals indicative of raw data to provide respective best fit characterizations. When these best fit characterizations are subtracted one from the other, the effect of the dielectric components and any environmental clutter is eliminated. The result of the subtraction is thus a relatively noise free indication of the stimulated emission spectral line.

Thus, as a first part of the subject invention clutter cancellation utilizing linear regression involves taking a reference sample and doing a linear regression on the reference sample to provide a best fit sample centered around zero. This process in essence linearizes the reference sample by eliminating noise components. This linearized reference sample is stored.

The data that is provided from the balanced and terminated transmission line reflecting stimulated emissions is likewise subjected to a linear regression processing step or least squared fit. With the linear regression of the stimulated emission raw data one has a best fit or approximation of this data to a linear line. It will be appreciated that the linear regression of the stimulated emission raw data is likewise centered on zero such that subtracting the two linearly regression processed signals, one from the other, results in a relatively uncluttered and pure indication of a spectral line or spike, with clutter-induced and dielectric-induced artifacts removed.

While the clutter cancellation system described herein results in a relatively robust method of detecting the presence of the stimulated emission, cross correlation with a library of signatures of various molecules increases the signal-to-noise ratio of the measurement to over 10 dB. Thus even with a signal that is buried 70 to 80 dB down in clutter, one can provide relatively robust stimulated emission detection, both because of the clutter cancellation and because of the cross correlation.

This signal-to-noise ratio of 10 dB is predicated on for instance sending a number of watts of energy down the terminated balanced transmission line. However, it is possible for instance to increase the signal-to-noise ratio by increasing the power delivered to the balanced transmission line. For instance, if one were to go from several watts to 100 watts, one could increase the signal-to-noise ratio to 40 dB.

One of the interesting features of the subject system is that by utilizing the balanced transmission line, this transmission line is not an effective antenna and does not serve as a receive antenna for a large amount of the environmental clutter. Thus, the subject technique in combination with a balanced transmission line even further increases the robustness of the stimulated emission response detection due to the fact that it is relatively impervious to signal sources or noise sources that are away from the balanced transmission line.

By way of definition, it is noted that in statistics linear regression is any approach to modeling the relationship between a scalar, or a variable Y and one or more variables denoted X. In linear regression, models of the unknown parameters are estimated from the data utilizing linear functions. Such models are called linear models. Most commonly, linear regression refers to a model in which the conditional mean of Y given the value of X is an affine function of X. Less commonly, linear regression can refer to a model in which the median, or some other quantile of the conditional distribution of Y given X is expressed as a linear function of X.

Note that linear regression models are often fitted using the least squares approach.

The salient feature of the least squares approach to linear regression utilized in the subject invention is to be able to remove clutter artifacts by being able to characterize the signal including clutter in such a way that artifacts due to clutter are minimized. This is done by treating these components as much less important. In so doing the resultant curve is centered about zero. Thus, inter alia, removes any curve distortions due to the presence of a dielectric.

Note that the method of least squares is a standard approach to the approximate solution of over determined systems, i.e. sets of equations in which there are more equations than unknowns. "Least squares" means that the overall solution minimizes the sum of the squares of the errors made in solving every single equation. The most important application of least squares approach is in data fitting, especially the data fitting described here. The best fit in the least squares sense minimizes the sum of squared residuals, a residual being the difference between an observed value and the fitted value provided by a model.

Thus, the least squares approach fits the data to a curve and it is from this curve, in this case both a reference curve and a stimulated emission data curve such that the least squared fitted data can be compared and a spectral line observed.

In summary, a nuclear quadrupole resonance system which senses the stimulated emission from target molecules includes in a calibration step and a stimulated emission response detection step, with the system employing clutter cancellation involving linear regression and the use of cross correlation with a series of known molecular signatures, both increasing the signal-to-noise ratio of the system.

BRIEF DESCRIPTION OF THE DRAWINGS

These and other features of the subject invention will be better understood in connection with the Detailed Description, in conjunction with the Drawings, of which.

DETAILED DESCRIPTION

Figure 1:
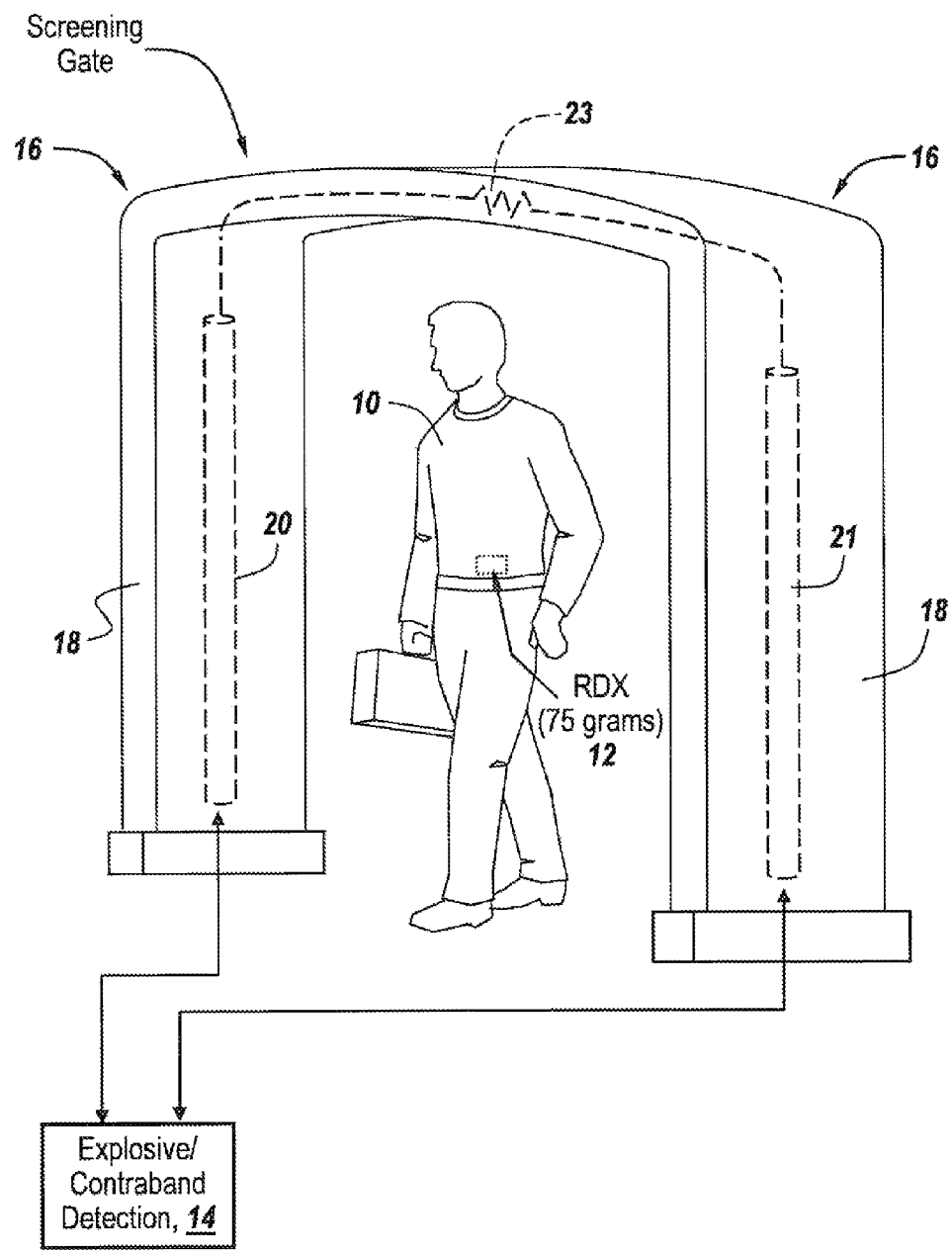
FIG. 1 is a diagrammatic illustration of the detection of an explosive hidden on an individual as the individual walks through a balanced transmission line coupled to an explosive/contraband detection unit that utilizes nuclear quadrupole resonance in which, in one embodiment, RDX spectral lines are detected to ascertain the presence of an explosive.

In the early 1900s, not long after Einstein published his equations on thermal equilibrium, individuals realized that there were likely to be resonances at very low frequencies for atoms and molecules and that these resonances would occur because if one emits a photon of exactly the correct frequency, the material will absorb this photon, store it for some amount of time and then get rid of the absorbed energy. It is has been found that in nature the molecules which absorb such energy always fall to a lower energy state.

One of the ways for the material to emit energy is through spontaneous emission where a photon of exactly the same energy that is impinging on the material is thrown off in a random direction at random times.

The second way of getting rid of the energy absorbed by the material is through process of stimulated emission in which a photon arrives at exactly the appropriate energy, gets near the molecule, stimulates the molecule and when the molecule drops to the lower energy state it emits a photon that is exactly in phase with the original photon.

The energy that is thrown off either in spontaneous emission or stimulated emission results in an exceedingly narrow spectral line. In fact the line is generally considered to be a single line that exists at a given wavelength or frequency. It is noted that the material only has one choice assuming that the material is pumped at its lowest energy state, raising the energy within the molecule such that the only way that it can release its energy is to emit a photon of that exact energy.

Nuclear quadrupole resonance has been utilized in the past to detect the presence of specific molecules, including explosives. Explosives generally involve the use of nitrogen or nitrogen bonded with other elements. When nuclear quadrupole resonance was utilized in the past, it was used to detect the presence of molecules due to the molecular elements that are bonded together such that the molecules absorb energy at for instance as many as eight different energy levels or spectral lines. It turns out that at least three of the energy levels tend to be prominent, although in some materials there are upwards of all eight energy levels for one bond. If one has many bonds there may be many dozens of spectral lines. In order to detect the presence of a molecule one usually is looking to pump energy right at the top of one of the spectral lines and look for energy coming back at the same frequency.

As part of the subject invention, it has been found that the spectral lines of interest especially for explosives are in the 100 KHz to 10 MHz range. A particularly interesting explosive is called RDX which has a spectral line in the 3 to 4 MHz range, as does sodium nitrate.

However if one is seeking to detect stimulated or emission or spontaneous emission at 3 MHz, the wavelength of the returns is incredibly long, in some cases corresponding to the size of a building. Moreover, the photons that are emitted in either spontaneous or stimulated emission represent very little energy. For instance, a red photon carries an energy of about 3.5 electron volts, with detectable radiation being one or two millionths of 3.5 electron volts. The result is that photons emitted from the molecules are virtually undetectable. One of the reasons is that in order to detect single photons one is faced with thermal background that overwhelms the detection process. In order to achieve any type of result, one pumps large numbers of photons into the target material such that for every milliwatt second an extraordinary number of photons are involved.

If the photons are at the appropriate frequency they are absorbed and only when the frequency exactly corresponds to a resonance line does the molecule start absorbing the photons. Thus it is quite important that the frequency source utilized in the nuclear quadrupole resonance measurements be extremely precise and stable.

If one performs a frequency sweep, the emission that comes back is on the order of 1% of the energy that impinges on the molecule.

It is noted that prior nuclear quadrupole resonance techniques can be likened to looking into a headlight to find a 1% response.

As a result, a pulsed coil prior art nuclear quadrupole resonance detection of molecules requires upwards of 100 kilowatts of energy coupled to a very high Q tuned coil having for instance a Q of 80 or better. If there is any offset in terms of the frequency of the incident radiation or if the coil tuning was not precise, then any emissions from the molecule will be lost in the clutter.

First and foremost in the prior art pulsed coil nuclear quadrupole resonance techniques, it was only with difficulty that one could in fact detect any response. One of the reasons is because the coil exhibits a large dwell time after which one looked for a response.

If one did not wait, the incoming radiation would swamp the detectable results. In order to eliminate this problem, those in the past used a pulsed source and then waited for a response after the trailing edge of the pulse. Prior systems thus pumped pulsed energy into a coil with the target material at the center of the coil. Thereafter the material would absorb energy and then the prior systems would listen for the spontaneous decay.

The problem with spontaneous decay is that at thermal equilibrium a spontaneous photon happens only once for every two million stimulated photons. Thus, in terms of detecting spontaneous decay, one is at an extremely difficult power disadvantage. Secondly, the spontaneous decay might happen over several tens of milliseconds which means that the instantaneous power levels at any point in time are very low. For spontaneous decay using a pulsed coil nuclear quadrupole resonance, the problem is that one is working with very few photons and further they are stretched out over time. This means that one has to use huge amounts of power to overcome these problems, often in the nature of kilowatts of energy. Moreover, because one is looking at very low signal strength the coil is made with a very high Q. This means that the coil couples well with the environment, that in turn means that the coil picks up a great deal of background noise.

Pulsed coil nuclear quadrupole resonance detection systems have been marginally cost effective and their power density has exceeded human safe limits.

More specifically, taking RDX as an example, the bandwidth of the RDX resonance is about 400 hertz. This means that the associated decay time or relaxation time is on the order of 2.5 milliseconds. If one were to sweep the frequency through the resonance as one approaches the resonant frequency, what happens is that one excites the nucleus of the nitrogen atom. When the nucleuses are excited they go into an upper state and then as one sweeps by the frequency there is a population inversion in these nuclei at which time they start to decay.

If one utilizes a long CW pulse what would happen is that one would see a periodicity of absorption and emission. When the CW pulse is turned on, the molecule goes into the excited state but then relaxes through stimulated emission. What would happen utilizing a CW signal is that one would see a series of absorptions and emissions that would occur every 2.5 milliseconds.

For RDX, assuming a pulsed coil system, one must use a pulse width of about half a millisecond because the pulse has to decay down fast enough so that the spontaneous emission can be observed.

Thus in the past a relatively short pulse of CW energy was used to enable listening for the response. However, in order to be able to detect the response at all, a very high Q coil was required. High Q coils have an excessive relaxation time. As a result, in order to provide for the ability to listen when driving a very high Q coil at half a millisecond one has to have other circuitry to quench the coil as fast as possible so as to be able to listen to the return, typically in terms of a little hiss that comes off after irradiation with the pulse.

Thus, in the prior systems one had to have exceedingly large kilowatt sources of 3 MHz energy in order to obtain enough of a response, and then had to pulse the source so as to be able to stop it and quench it in time to be able to detect the minuscule response that would occur.

Having the high Q coil further was complicated by the fact that one could not frequency sweep a sample because the high Q coil resonates at only one frequency.

This for instance precludes the ability to distinguish between the detection of multiple spectral lines to be able to distinguish the spectral response of the target molecules from the spectral responses from uninteresting molecules.

Also, when using a high Q coil one has to use an exceedingly large amount of shielding to make the system safe for use around people, as well as having to actively quench the coil.

Moreover, when pumping 1 kilowatt into a coil, the presence of the system is very easy to detect. Thus, terrorists could avoid screening knowing that such a detection system was in operation.

Note that the pulsed coil system detects spontaneous not stimulated emissions. Spontaneous emissions are not coherent and one obtains the square root of the power coming back.

Thus, in the past it has been virtually impossible to provide a workable system that would reliably and safely detect dangerous amounts of explosive material hidden on a human.

Note that in the basic NQR technique for which the subject calibration and cross correlation system is proposed, rather than using the high power noise-prone pulsed coil system for detecting nuclear quadrupole resonance lines due to spontaneous emission, stimulated emission is sensed. For stimulated emissions, the energy produced by the molecule is not spontaneous and it is not happening randomly. Rather, the emission that is seen in the stimulated emission is coming back exactly in phase with the incident radiation, namely a coherent response.

As discussed in the above-mentioned co-pending patent application, in the basic NQR system a low power swept frequency source is used in combination with a probe in the form of a terminated balanced transmission line in which molecules including explosives, narcotics and the like that are located between the transmission line elements are detected. In this system the result of the absorption of the milliwatt/watt energy is picked off with a directional coupler or circulator so as to eliminate the transmitted energy from swamping the received energy. What is seen is the 1% stimulated emission coherent result that is exactly in-phase with the transmitted signal. It is the coherent in-phase relationship that permits integrating the weak signals into a detectable result.

As a result of utilizing the directional coupler the transmitted signal is rejected. Moreover, the utilization of a balanced transmission line essentially has a zero Q, thus eliminating the background noise associated with the high Q coils. Moreover, since the transmission line is not resonant at any one frequency, a sample can be frequency swept or simultaneously irradiated with signals at multiple frequencies. Additionally, there is no frequency limit to the sweep frequency since there are no tuned circuits involved.

In one embodiment, the energy is step wise swept so as to be able to correlate the result with spectral lines of a known molecule while being able to reject returns from molecules having other spectral lines.

It has been found for explosives such as TNT, PETN and RDX and other molecules of interest that sweeping between 100 KHz and 10 MHz is enough of a sweep to discriminate against non-target materials. For instance, while one might be looking for the spectral lines associated with RDX, one would also like to be able to ignore the spectral lines of for other materials, or for that matter glycine which is present in a great many biologic materials.

This system is typically operated at between 200 milliwatts up to 10 watts, making the system much safer than the high power kilowatt pulsed coil nuclear quadrupole resonance systems. Moreover, quenching is unnecessary.

For robust detection of the stimulated emission, more than one spectral line can be considered as an indicator of the molecule. For instance, for RDX one might wish to look at two or three of the RDX spectral lines. If it turns out that glycine is present, and if in fact one of the RDX spectral lines share a spectral line with the glycine, then one could ignore the overlapping spectral line.

While scanning network analyzers can be utilized as frequency sources for this system, due to the fact that the transmission line does not discriminate from one frequency to the next, it is possible to connect multiple frequency sources in parallel to feed the transmission line resulting in simultaneous evaluation of several frequencies.

It is also possible to use a pseudo-random number code pattern so that the system would be difficult to jam. Moreover, the low power system is hard to detect, obscuring the fact that any scanning is going on at all.

In one embodiment while one could scan from 100 KHz to 10 MHz, this type of scanning procedure wastes a large amount of time and is not necessarily beneficial. If one is only looking for specific resonance lines, the scanning can be scheduled to appropriately frequency hop, thus dramatically reducing scanning time.

Note in the basic NQR system described above no single detection of a spectral line is used to declare the presence of the target material. Rather, the system desirably requires multiple hits in order to declare the presence of the target material.

It is also noted that the basic NQR system looks at the stimulated emissions, as opposed to the spontaneous emissions, primarily because the spontaneous emissions are perhaps one two millionth of the power of the stimulated emissions. This is important because, as mentioned above, in determining the presence of a target molecule, one is seeing only 1% of the incident energy being returned.

Further, RDX resonances have a bandwidth of approximately 400 hertz, which as mentioned above, results in a decay time or relaxation time of about 2.5 milliseconds. Assuming a stepped sweep approach, the nucleus of the atoms making up the molecules are excited and when they go into the upper state, there is a population inversion in these nuclei, with the stimulated emission occurring immediately thereafter. Note that the stimulated atoms that have been inverted relax coherently such that there is a coherent response back to the probe. Because of the 2.5 millisecond relation time stepped sweeps would have to be adjusted accordingly.

Since there is no coil involved, one does not have to use quenching and since one uses a directional coupler to ignore the transmitted signal, one does not have to stop and listen in order to get adequate readings.

Moreover, in one embodiment, a cancellation algorithm is utilized in which the transmission line is observed without a sample between the transmission line elements during a calibration sweep. Thereafter, any material that is between the transmission line elements has results that are subtracted from the calibration sweep results. Thus, if there are any peculiarities in the analyzer or transmission lines, these peculiarities are subtracted out. As a result, steady state noise is nulled out. Enhancements to this cancellation system are that to which the subject invention is directed.

Note, the reason for the use of the transmission line is that it focuses all the energy between the two balanced leads or elements. Because a balanced transmission line is the world's worst antenna by design it does not leak energy to the environment, unlike a coil. Concomitantly, the transmission line does not receive interference from the environment, making the subject system an extremely quiet system.

The basic NQR system is implementable in a number of different forms such as providing two spaced apart transmission line elements to either side of a gate or portal through which an individual is to pass. Such a portal may be an airport security checkpoint. Moreover, two pieces of copper pipe or copper tape may be placed on opposing walls down a corridor to form the transmission line, or the balanced transmission lines can be placed on a road to detect the passage of target material between the transmission line elements. Additionally, the transmission line could for instance be configured as opposed guard rails.

Considering for instance that a terminated balanced line contains two elements, one element is called a plus element and the other is called a minus element. The magnetic flux lines are in a plane perpendicular to the axis of the elements. In one configuration, a large area can be covered using a number of side-by-side plus/minus lines. For instance, these lines could be laid out in a carpet at an airport to track people carrying explosives on their person. Thus, one can monitor the transmission lines to be able to tell where someone carrying explosives is walking and to be able to track their path.

It will be appreciated that the basic NQR system, by avoiding the high Q coil, also avoids the large amount of shielding necessary for public safety or the safety of those operating the equipment. Also, as mentioned above, there is no need to actively quench any part of the probe in order to be able to listen to the relatively small returns from the irradiated sample.

Rather than having to run a kilowatt into a coil, in the subject invention successes have been reported at a 200 milliwatt level with excellent signal to noise ratios. Thus, there is the ability to operate at a 30 dB lower power levels than a pulsed coil. This means that the entire system can be run at low power. The result is that the NQR system does not interfere with magnetic media or people's safety and is very hard to detect any distance away from the test site. Thus, even standing a few feet beside the balanced transmission line one is not able to detect it. As a result, a person would not know that he or she is being monitored. Also, if a pseudo-random hopping schedule is utilized, detection of the presence of such a system is virtually impossible.

As will be appreciated, the conductors for the transmission lines could be for instance as large as a two inch pipe, or could in fact be flat transmission line elements. It is also noted that the termination resistance is equal to the impedance of the transmission line. In one embodiment, the space between the elements is about 2.5 to 3 feet, such that one could conveniently paint conductive stripes on opposing sides of a corridor, with the impedance being controlled by how tall the stripes are and how far apart the stripes are. For a corridor-sized installation one might have a conductive stripe on either side of the corridor that is 11 feet long and about a foot tall. Also with larger areas one needs more power to create the flux density required. Thus if one considers a 12 foot long probe, this requires about 36 times as much power as a miniature probe. It is the power density (watts/meter^2) that remains constant.

Regardless, one can obtain adequate results in a corridor type situation with between 7 and 10 watts of power into the probe.

The amount of power required is dependant on how much material one is trying to detect and also the flux density that one is trying to excite it with, as well as how much integration time is available.

Small amounts of explosives can be carried on the person in the persons clothing, swallowed, or can even be surgically implanted, which would be virtually undetectable through a physical examination of the person and also through standard X-ray techniques. Thus for the creative or diligent terrorist, it may be of interest to provide pockets of the explosive within the body of the individual that could not be readily detected by present techniques.

It is noted that the maximum flux density given two spaced apart conductors is on a line between the two conductors, with the minimum being outside the transmission line. As one proceeds to the edge of the conductors, one obtains more flux density. However, the flux density does not very significantly in a direction normal to the plane between the two transmission line elements so it is possible to get reasonable coverage for a human sized object or even a truck sized object above the transmission line. Note that the transmission line impedance can typically be between 100 and 1,000 ohms which is not critical. The critical component is the flux density, with the critical flux density being approximately 1 watt per meter$^2$.

With a flux density of less than 1 watt per meter$^2$, the signal-to-noise ratio is less for the same integration time. If the flux density is greater than 1 watt per meter$^2$, then the signal-to-noise ratio is improved because of the coherent signal. The result of the coherency is that the signal-to-noise ratio improves linearly with how much integration time is utilized.

Integration time refers to the collection of the results of multiple stimulated emissions over time. As a general rule, one has to dwell on the target material for whatever is the inverse of the particular bandwidth involved. Bandwidths in the subject case are on the order of a 100 to 500 hertz which results in dwell times of between 1 and 5 milliseconds.

Of course, as mentioned above, one need not frequency hop in 1 to 5 millisecond intervals because there is no reason why one cannot monitor multiple lines simultaneously or even feed the lines with parallel-outputted frequency generators. In short if one were using three signal generators coupled to the same transmission line, one could sense three different spectral lines simultaneously.

Since the basic NQR system can sample multiple frequencies simultaneously this is considerably different from the pulsed coil nuclear quadropole resonance systems that tend to tune a coil for a specific frequency because of the need for the high Q. Thus, in the subject system one can track the results over the entire bandwidth utilizing the same balanced transmission line probe.

As a result, the subject system is capable of detecting an entire class of explosives, whether they are people-born or vehicle-born. Moreover, the subject system may detect contraband such as narcotics, with many narcotics having very specific nuclear quadrupole resonance signatures. This includes cocaine and heroin.

It will be appreciated that for some complex organics the spectral lines tend to be larger, such as those associated with glycine. Glycine, even in its usual 5% concentration for dietary supplements, for instance, can be distinguished by recognizing the glycine spectra and subtracting out the nuclear quadrupole resonance signature. As a result, if it turns out that one of the spectral lines happens to be right on top of the molecule of interest, the subject system provides way to discriminate against the non-target molecules.

Another application is to be able to detect explosives in shipping containers. In such cases one has an incredibly long integration time available, for instance weeks during which the inspection can take place.

Another different application for the basic NQR system is in the production of molecular compounds. Explosives for instance have a certain composition which involves a very specific ratio of the molecular components. It has been found that the basic NQR technique can be used to verify the specific percentage ratio of the components in the test sample, so that one can non-destructively inspect materials during production without damaging it.

It has been found that the detected spectral lines are one-to-one correlatable with the ratio of the molecular constituents in a compound so that the measurements are a very accurate prediction of the actual ratio of the elements in the compound.

Moreover, it has been found that the stability of the frequency source and its accuracy is important with respect to the stability of the oscillators involved, with the aforementioned cancellation requiring suitably stable oscillators.

With suitably stabilized oscillators in the form of for instance multiple network analyzers, one can digitally synthesize multiple frequencies simultaneously. Fast-Fourier transforms are then used to sort out the frequencies. In this case one piece of hardware can generate multiple frequencies simultaneously. This cuts down the time that the specimen has to be between the elements of the balanced transmission line, thus for instance to be able to detect somebody who is running with explosives.

For stepped frequency sweeps, one can allocate 5 milliseconds per frequency. If one is analyzing 10 spectral lines then one is doing so in 50 milliseconds. However, the problem is that there may be 40 or 50 different prominent explosives, all with different spectral lines, and hundreds of compounds that have spectral lines in the same region. Thus instead of processing 10 spectral lines, one might have to process 1,000 spectral lines. At 50 hertz, this corresponds to a dwell time of 5 seconds and necessitates synthesizing all frequencies of interest simultaneously.

In summary, in the basic NQR system stimulated emissions due to nuclear quadropole resonance are detected utilizing a terminated balanced transmission line and a directional coupler, thus to detect explosives, contraband, narcotics and the like that exist between the transmission line elements. In one embodiment, a stepped frequency generator is utilized to provide a scan between 100 KHz and 10 MHz. In another embodiment, parallel frequency sources are coupled to the transmission line, either embodiment permitting correlation with expected spectral lines, with the frequency sources being low power so as to not create a safety hazard and so as not to interfere with radiation sensitive devices such as film or electronic circuits that are in the vicinity of the balanced transmission line probe.

The Basic NQR System

Prior to describing an enhanced NQR system which enables robust stimulated emission detection, referring now to FIG. 1, for the basic NQR system an individual 10 may be carrying on his or her person some contraband or explosives 12 which may for instance may be secreted in his or her underwear, or could even be surgically implanted. One such explosive is RDX and it is the purpose of the subject invention to be able to detect explosives in as little quantity as 75 grams which is approximately about a fifth of a cup. Terrorists and the like are using more and more sophisticated ways of secreting explosives and/or contraband and a physical examination of the individual may not yield the presence of such explosives or contraband. Not only may the explosives or contraband be surgically implanted in the individual, they may be swallowed in bags and be held internally in the gut until such time as their "removal".

Present systems for detecting such explosives or contraband such as back scatter X-rays are not effective to detect such secreted items and the use of higher power radiation is counterindicated for safety reasons.

On the other hand, as shown in FIG. 1, an explosive or contraband detection system 14 utilizes nuclear quadrupole resonance in which swept frequencies are applied to a balanced and terminated transmission line 16 embedded in a screening gate or housing 18 in which the elements of the balanced transmission line 20 and 21 as well as load 23 are embedded in the gate. The balanced transmission line has no frequency to which it is tuned, such that the application of signals for instance between 100 KHz and 10 MHz may be applied due to the non-tuned nature of the probe which is comprised of elements 20, 21 and 23.

As will be seen, the power necessary to detect nuclear quadrupole resonance is in general below 10 watts and often as little as 200 milliwatts, due to the subject explosives/contraband detection system which, inter alia, utilizes a directional coupler in the form of a circulator to cancel out the transmitted energy while receiving only the stimulated emission from the molecules in the target sample.

As used herein, the target sample 12 includes molecules having a particular recognizable spectrographic signature in which the spectral lines of the sample are recognizable when compared with the spectral lines generated through stimulated emission of all of the remaining molecules that surround the target sample.

For instance, glycine which is common in the human body has spectral lines that are distinguishable for instance from RDX spectral lines, with glycine in essence forming a background spectral signature which is to be distinguished.

While the NQR system will be discussed in terms of explosives, it is understood that the material under test may be molecules of any type having a known spectral signature. This includes contraband such as narcotics and other types of drugs such as heroin and cocaine which, due to the subject system in one embodiment involving stepped and swept frequency transmission enables one to eliminate the spectral signatures of non-target materials while being able to single out the spectra of target materials.

Figure 2:
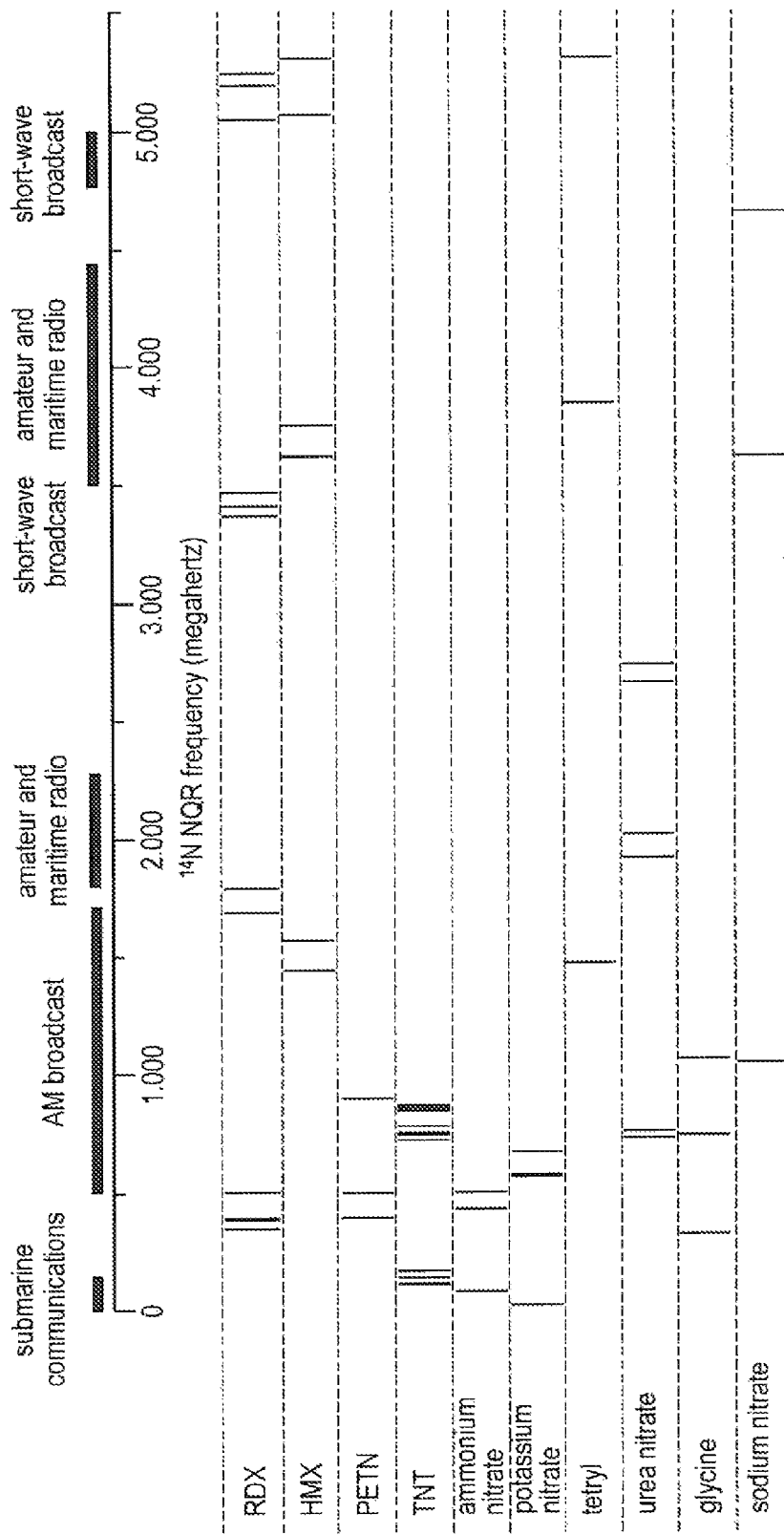
FIG. 2 is a graph showing the spectral signatures of a number of potential explosive materials indicating for RDX and HMX, a spectral signature in a 3-4 MHz range, with TNT indicating a spectral signature in the sub 1 MHz range as well as ammonium nitrate and potassium nitrate, with tetryl having a signature in the 3-4 MHz range and with urea nitrate having a spectral signature not only in the sub 1 MHz range but also in the 2-3 MHz range, noting that sodium nitrate has a very close spectral signature to one of the spectral lines of glycine.

Referring to FIG. 2, what is shown is a spectral chart for common explosive materials such as RDX, HMX, PETN, TNT, ammonium nitrate, potassium nitrate, tetral, urea nitrate and sodium nitrate, also as compared with the spectra of glycine.

What will be seen is that all of these materials have spectra between about 100 KHz and about 5 MHz, which spectra are detectable by the subject system. For instance, if one detects spectra of RDX in the 3-4 MHz band, this is clearly distinguishable from the glycine spectra which lie below 1.5 MHz.

Likewise one can distinguish PETN from RDX as well as being able to distinguish HMX from RDX due to the offset of the spectra of HMX in the 3-4 MHz band from the spectra of RDX.

Since the NQR system detects stimulated emission from all of the molecules in the sample between the balanced transmission lines, it is possible through correlation processing to be able to provide a probability of a match between the spectral lines of the target material as opposed to the spectral lines due from molecules that are not target materials and which constitute background.

Figure 3:
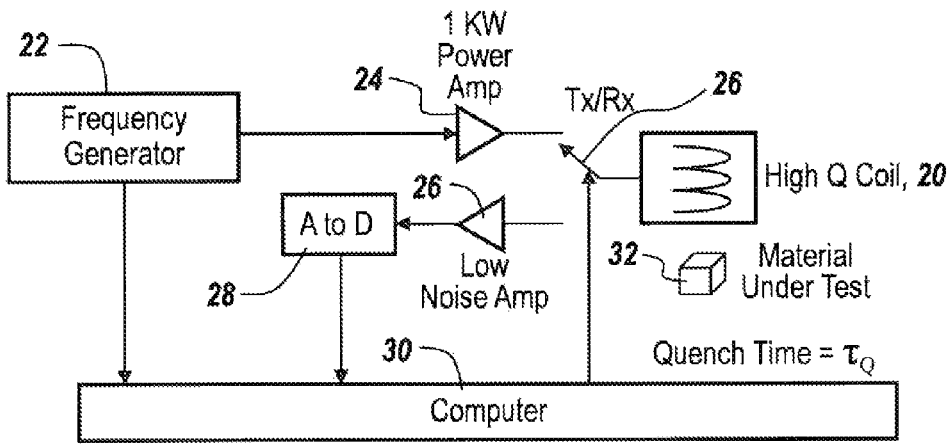
FIG. 3 is a diagrammatic illustration a prior art pulsed coil nuclear quadrupole resonance system illustrating the use of high power pulses and a high Q coil in which the system has a transmit-receive switch, the cycling of which depends on coil quench time.

Referring now to FIG. 3, what will be seen in the prior art pulsed coil nuclear quadrupole resonance system is the utilization of a high Q coil 20 which is driven from a frequency generator 22, the output of which is amplified by an amplifier 24 to the 1 kilowatt level. The signal from the amplifier is switched via a transmit/receive switch 26 and is applied to the coil during a pulsed sequence, with switch 26 being returned to the receive position at which point the high Q coil 20 is coupled to a low noise amplifier 26, to an analog-to-digital converter 28 and thence to a computer 30 for measuring the spontaneous emission response from material under test 32.

Figure 4:
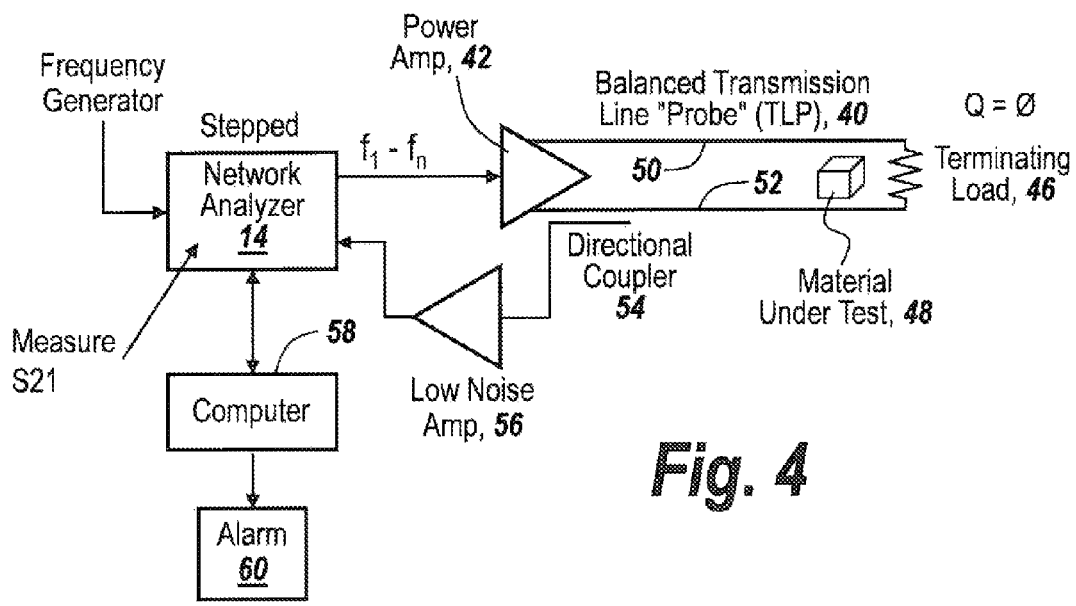
FIG. 4 is a diagrammatic illustration of the subject system illustrating a stepped network analyzer functioning as a frequency source for generating a number of stepped frequencies which are amplified by a low power amplifier to less than 10 watts in one embodiment, with the amplifier being coupled to a balanced transmission line probe in which the transmission line is terminated in a load and in which a directional coupler is utilized to detect the stimulated emission from a material under test, unimpeded by the output power applied to the transmission line.

In short, since the system described in FIG. 4 measures the spontaneous emission of the material under test and since in order to generate enough spontaneous emission high power was deemed to be necessary, the system of FIG. 4 is clearly not usable around human beings for safety reasons.

Moreover, in order to be able to eliminate the effect of the transmitted power with respect to the relatively low power of the receive signal, it was necessary to be able to quench high Q coil 20 so as to be able to see the return from the material under test. The quench time, $\tau_Q$, is problematic with respect to providing realtime measurements. It has been found that it is important to be able to provide circuitry to be able to quench high Q coil 20 in order to increase the pulse repetition frequency. However, the quench time when utilizing a high Q coil is problematic as mentioned above.

Moreover, the utilization of a high Q coil is problematic because it also collects background, which background can oftentimes obscure the results.

On the other hand and referring now to FIG. 4, a balanced transmission line probe 40 is coupled to a power amplifier 42 which amplifies a frequency generator 44 output, in one embodiment provided by a stepped network analyzer. The transmission line is terminated by a terminating load 46.

When a material under test 48 is placed between the balanced transmission line elements 50 and 52, it has been found that the stimulated emission from the material under test can be sensed utilizing a directional coupler 54 coupled to a low noise amplifier 56 which is in turn coupled back to the network analyzer 44 that detects the very low level stimulated response of the material under test. It is noted that network analyzer 44 is coupled to a computer 58 such that the returned signal can be processed and an alarm 60 activated if the material under test has a spectral signature match to that of a target material.

While it is possible to generate only one frequency corresponding to one the major spectral line of the target sample, it is useful to be able to scan frequencies for instance $f_1$-$f_n$ in order to obtain the spectral lines of whatever materials might be between the elements of the balanced transmission line. Because the balanced transmission line has a Q of zero, not only is it possible to couple a wide frequency range of signals to the transmission line, the Q of zero also means that there is very little outside interference with respect to the signals that exist interior to the transmission line.

Moreover it has been found that while the flux densities vary at various positions between the transmission line elements, at least in the plane of the transmission line elements, locating a material under test above or below the plane of the transmission line elements does not materially affect the readings.

Figure 5:
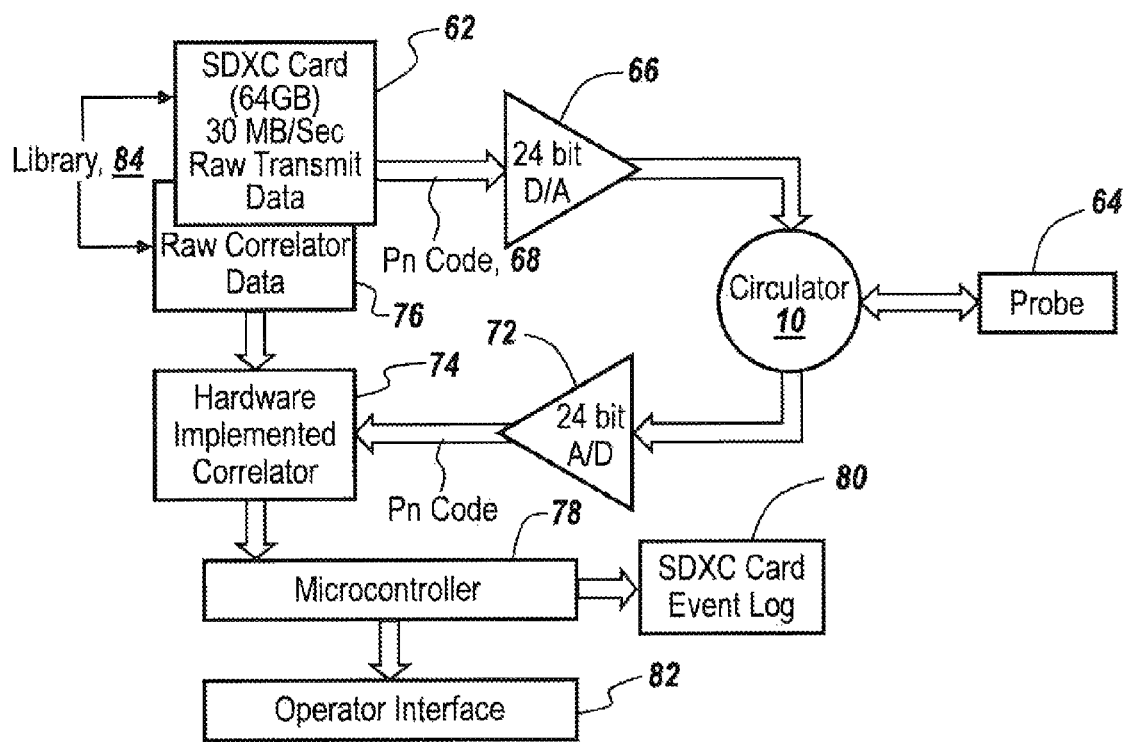
FIG. 5 is a block diagram of the subject system in which transmissions at various, stepped frequencies are applied through a 24 bit digital-to-analog converter to a circulator that functions as a directional coupler, with the output of the circulator being converted by a 24 bit A-D converter to correlate the returns with raw correlated data from a library, the output of the hardware-implemented correlator provided to a microcontroller for detecting the existence of a particular material present at the probe; Note that this system can be used to test several simultaneous frequencies simultaneously.

Referring to FIG. 5, in one embodiment an memory card (such as a SXDX 62 gigabyte card) having a 30 MB per second transfer rate may be utilized to generate the 100 KHz to 10 MHz signals that are coupled to probe 64 utilizing a 24 bit digital-to-analog converter 66 to which is applied a PN code 68 in one embodiment.

The utilization of a pseudo-random code is for defeating jamming, with the pseudo-random code being similar to that utilized in GPS systems for this purpose.

The input to the probe and the output from the probe are coupled to a circulator 70 which, as described above, completely eliminates the effect of the transmitted signal on the received signal, thereby to eliminate the problems of having to quench a high Q coil.

The output of circulator 70 is applied to a 24 bit analog-to-digital converter 72, with the receive PN code being applied to a hardware implemented correlator 74 that correlates the received stimulated emission information with raw correlator data 76 such that if there is a high correlation between the raw correlator data and the received data, microcontroller 78 may be used to drive memory card event log 80 and also provide an operator interface 82 alarm condition indicator.

Note that in terms of the generation of stepped frequency signals, a library 84 may be utilized that carries the spectral signatures of many types of target molecules. This results in the ability to generate a large variety of very narrow frequency signals which are applied to probe 64.

It will be appreciated that the frequency stability of the signal generator in the form of a network analyzer such as shown in FIG. 4 is critical due to the narrow nature of the spectral lines that are generated by the nuclear quadrupole resonance phenomena and the requirement of coherence.

Figure 6:
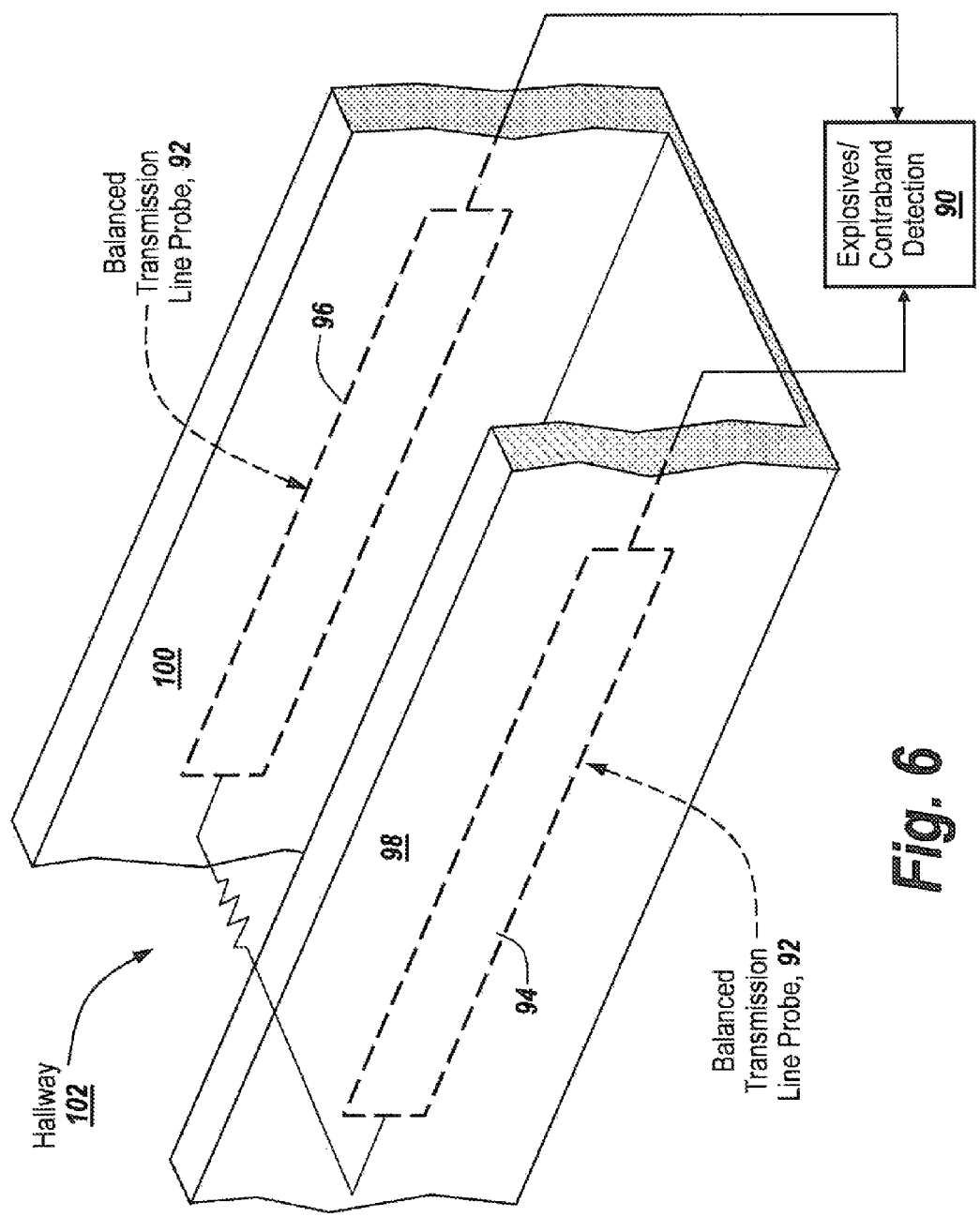
FIG. 6 is a diagrammatic illustration of an embodiment of the subject invention in which explosives detection includes the use of parallel foil strips on opposing walls of a hallway that function as a balanced transmission line probe for detecting target materials carried by a person walking down the hallway.

Referring now to FIG. 6, in one embodiment, an explosive contraband detection system 90 may be coupled to a balanced transmission line probe 92 which includes elements 94 and 96 embedded foil strips in hallway walls 98 and 100, with elements 94 and 96 terminated in a resistance load 102. In this case an entire hallway may be monitored for the presence of target molecules whether carried by a person or in some other conveyance as it transits down a hallway.

Figure 7:
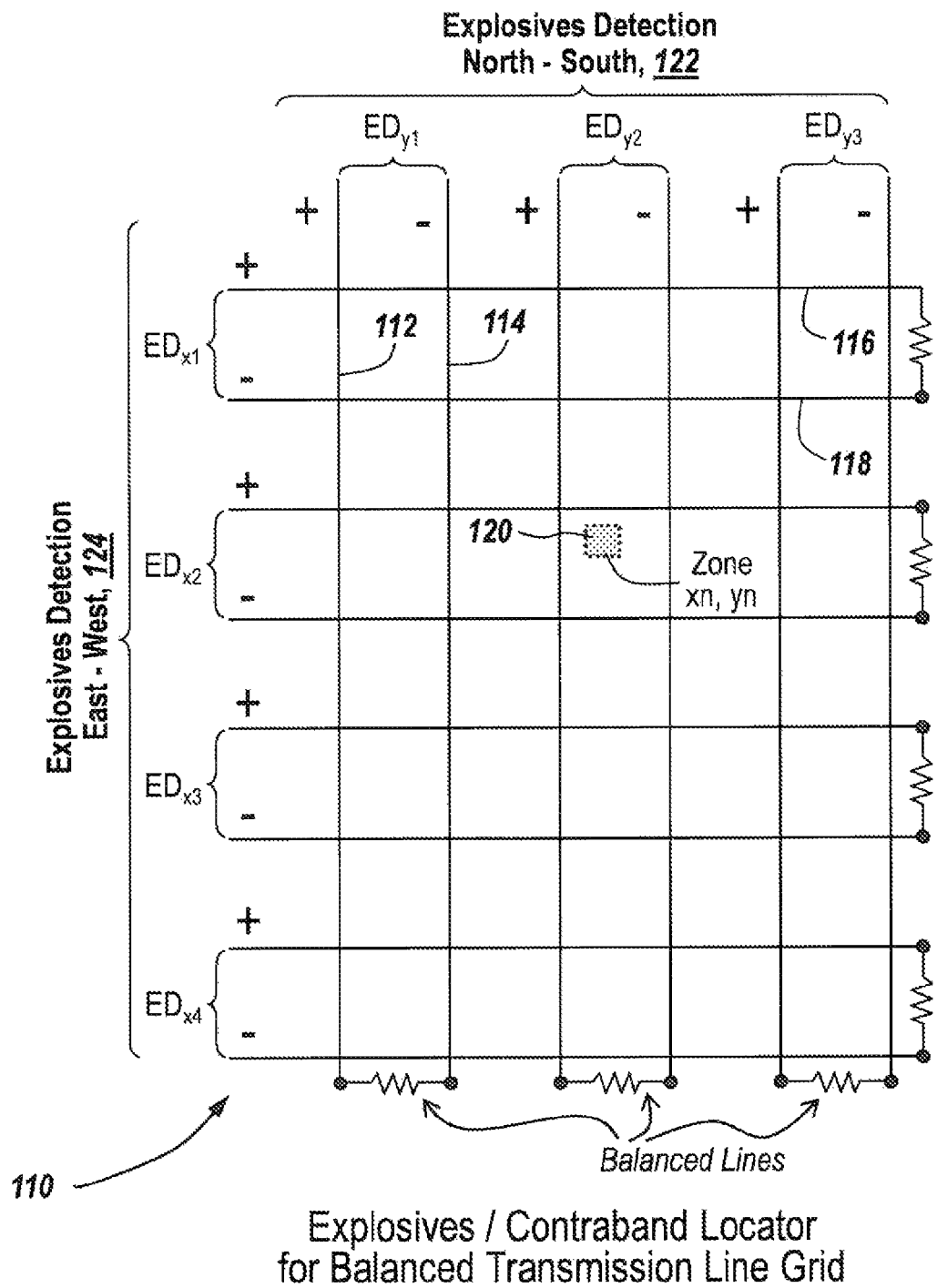
FIG. 7 is a diagrammatic illustration of the utilization of a grid of balanced transmission lines for the location of a target material carried for instance by an individual who traverses the grid.

Referring to FIG. 7, it is possible to provide a grid of balanced transmission lines here shown at 110 to include pairs of transmission lines for instance vertical pairs 112 and 114 indicated by the plus and minus nomenclature for the particular transmission line. Likewise, a crossing or transverse transmission line structure may include transmission lines 116 and 118. By monitoring the results on the various transmission lines one can localize the target molecule as illustrated at 120 as being at position $x_n$ $y_m$. This kind of grid, whether on the floor or surrounding a building can track the presence of explosives or contraband materials and therefore determine the track or path of the individual or conveyance which is transporting these materials.

For this particular embodiment the detection of explosives in for instance the north/south direction here illustrated at 122 is correlated with at explosive detection in east/west direction here illustrated at 124 to provide location.

Figure 8:
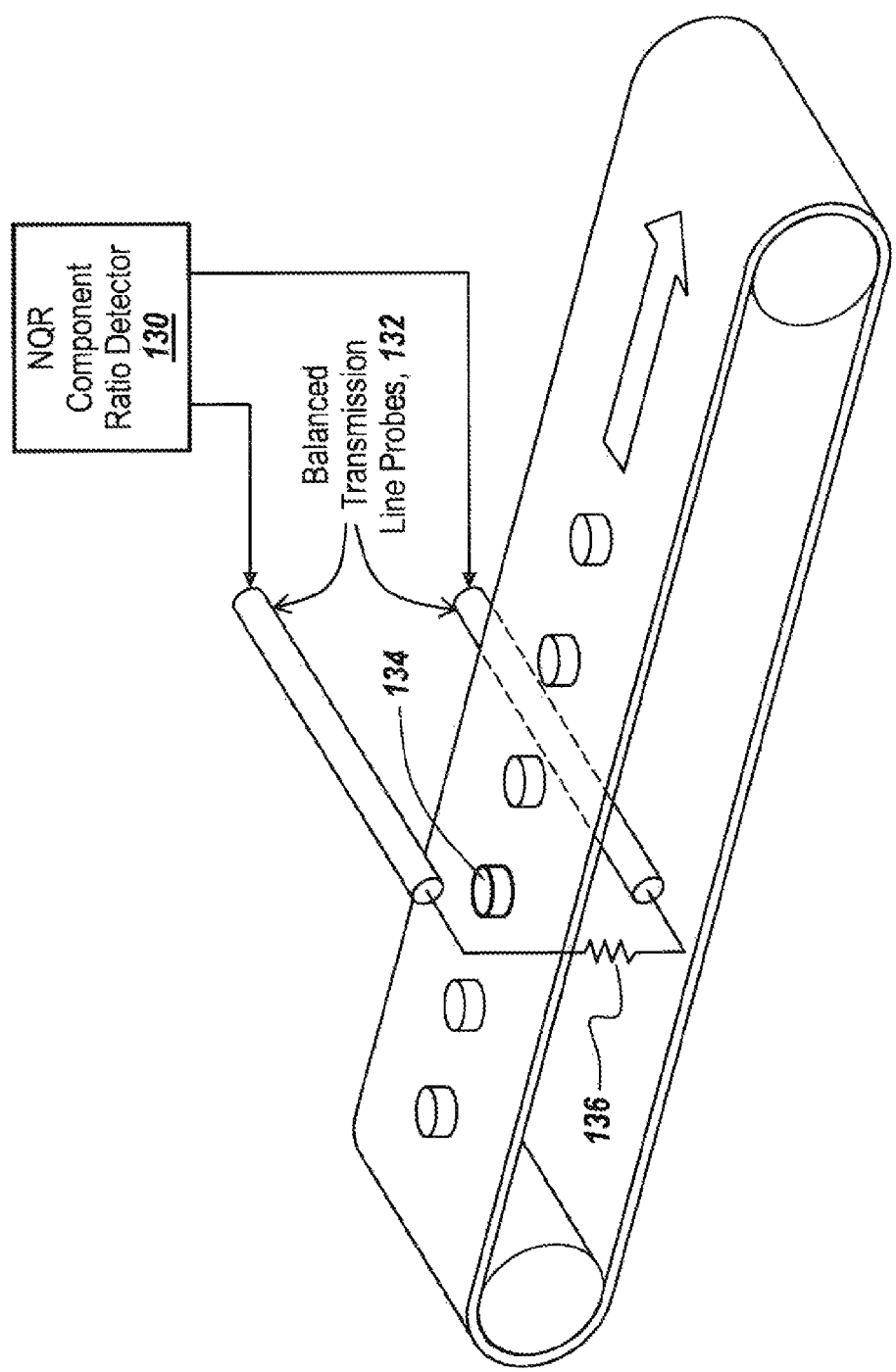
FIG. 8 is a diagrammatic illustration of the use of the subject system as a nuclear quadrupole resonance component ratio detector for detecting the ratio of molecular components in material proceeding down a production line to detect component ratios in a non-destructive environment on the fly as the material passes between the balanced transmission line probe elements.

Referring now to FIG. 8, one of the important characteristics of the subject system is that the molecular component ratio can be detected on the fly in a production line environment to provide non-destructive testing. Here a nuclear quadrupole resonance component ratio detector 130 is utilized with a balanced transmission line probe 132 to, for instance, detect the molecular composition of a drug 134 in pill form as the pills pass through the balanced transmission line probe. It has been found that by sweeping the frequency of the signals to the balanced transmission line probe one can detect not only the spectral lines of the various components in question, but also can detect the ratio of the target components.

Thus, rather than having to perform destructive tests in order to ascertain the constituents of a product being manufactured, one can non-destructively detect the component ratios utilizing the subject nuclear quadrupole resonance system.

Figure 9:
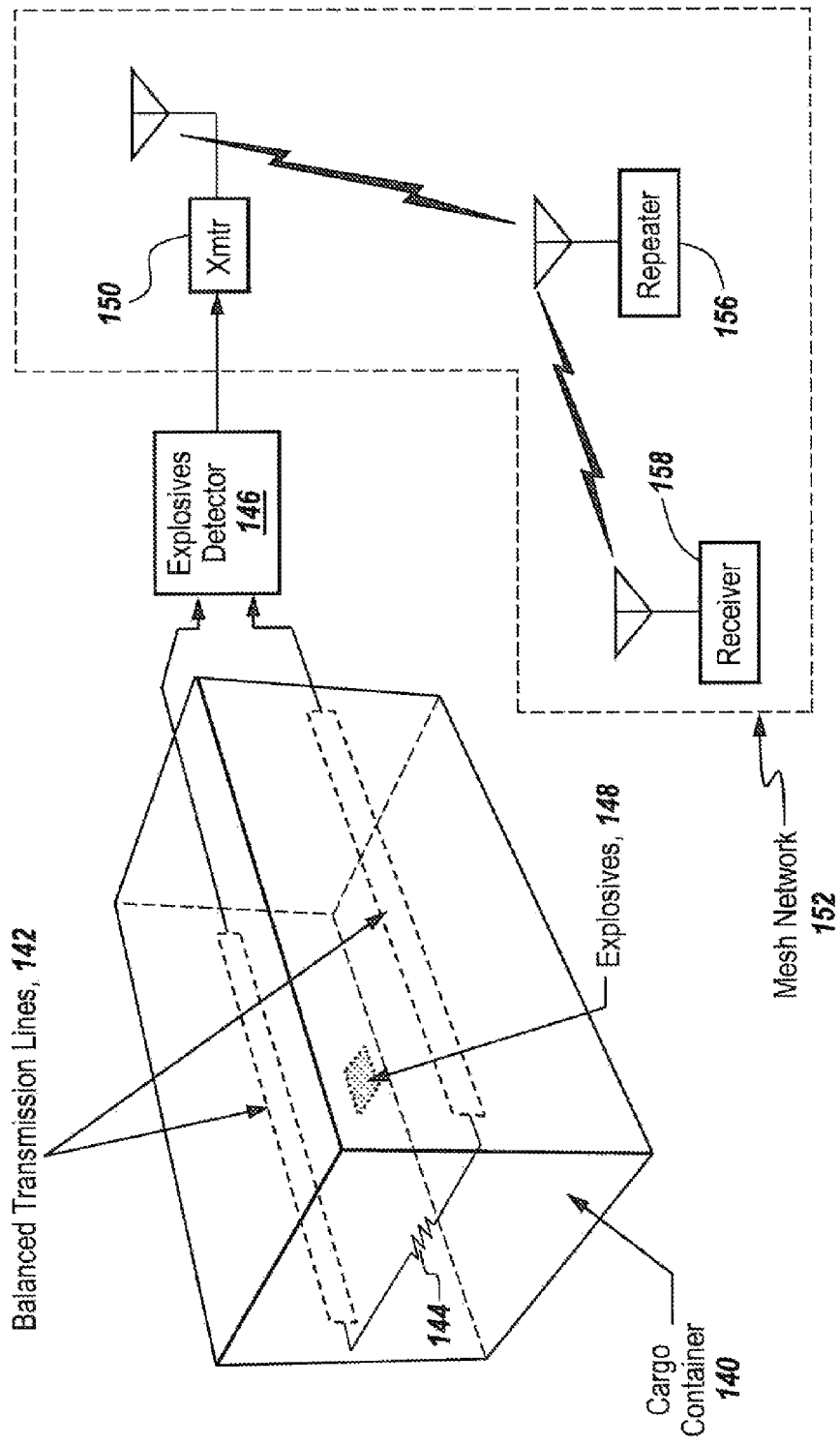
FIG. 9 is a diagrammatic illustration of a shipboard container inspection system utilizing the subject system in combination with a mesh radio network to report incidents to a cargo control room.

Referring to FIG. 9, another embodiment of the basic NQR system is the ability to track the contents of cargo containers that may either be placed shipboard or on other modes of conveyance in which, as illustrated, a cargo container 140 may be provided with internal balanced transmission lines 142 terminated as illustrated at 144 and coupled, for instance, to an explosive detection system 146 of the subject nuclear quadrupole resonance variety. If for instance the containers contain explosives or contraband, here illustrated at 148, whether these materials are initially placed in the container or later clandestinely placed into a sealed container, their presence can be detected as illustrated at 146 by an explosives detector. Through the use of a mesh network 148, the detected results can be communicated from explosives detector 146 and a co-located transmitter 150 which is part of a self establishing mesh network 152 aboard a ship to the cargo control room. Mesh network 152 includes one or more repeaters 156 which relays the information from transmitter 150 to a receiver 158 in the cargo control room.

It is noted that when monitoring containers, due to the length of time on board ship, the integration times available for the sensing of the stimulated emissions are dramatically increased. This long integration time can accommodate lower power detection. What this means is that an exceedingly robust system is available for detecting the relatively minute simulated emissions, with integrating occurring over a long period of time, thanks to the fact that the containers are in transit for substantial periods of time. While this embodiment of the subject system has been described in terms of shipboard containers, any kind of container monitoring on conveyances is within the scope of the subject invention.

It is also possible for instance to utilize the basic NQR system to detect contraband or explosives in trucks that pass through a portal. This is possible due to the relatively thick skin depths associated with metal containers that permit penetration of low frequency signals so that the transmission line carried signals can penetrate well into the containers. Thus, the subject system may be utilized to detect not only person-carried contraband and explosives, but also truck or vehicle-carried contraband or explosives, as for instance they proceed through a portal or checkpoint.

Figure 10:
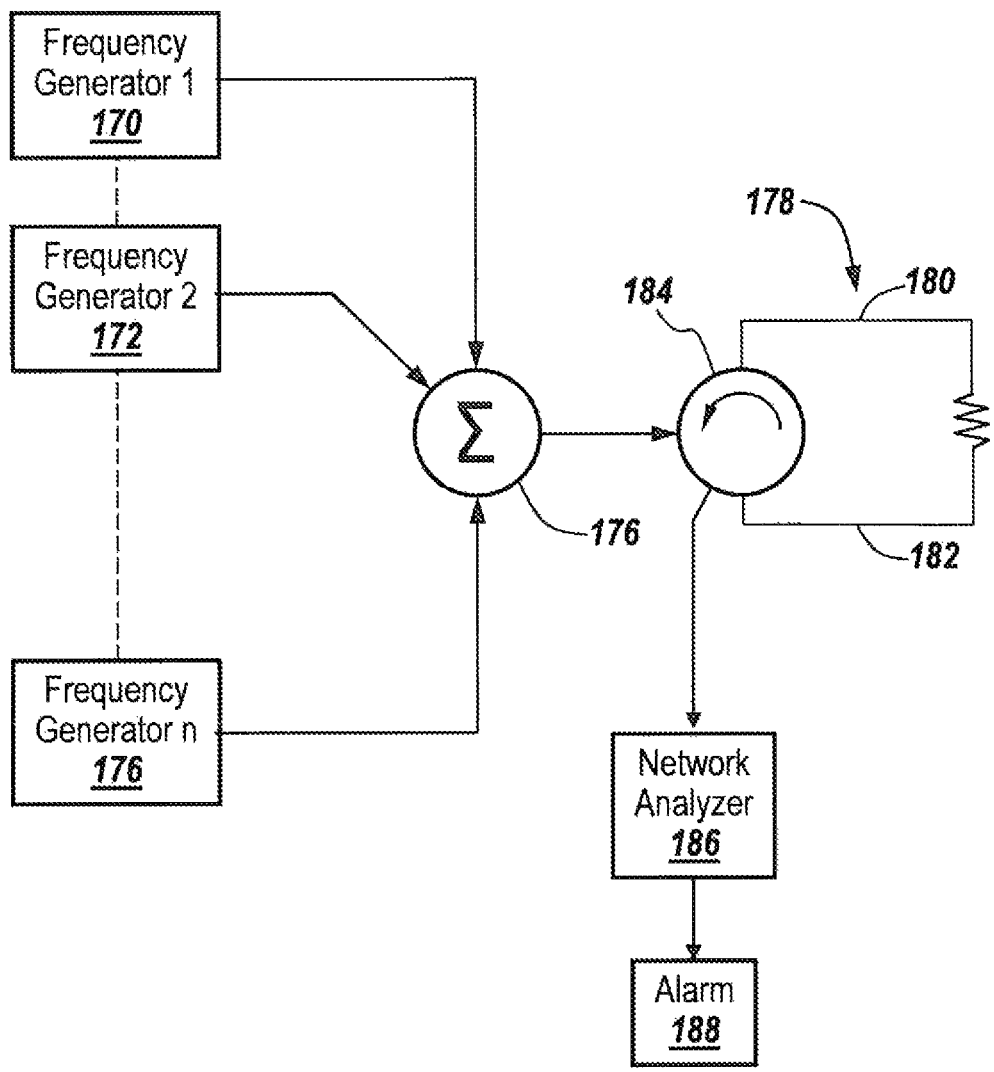
FIG. 10 is a block diagram of parallel-connected frequency generators coupled to a terminated balanced transmission line.

Referring now to FIG. 10, while the basic system has been described in terms of stepped frequency production, it is possible to use a parallel-connected set of frequency generators 170, 172 and 174, the outputs of which are summed at 176 and applied to a balanced transmission line 178 having elements 180 and 182 through a circulator 184. It is also possible to synthesize multi frequency signals digitally. The output of circulator 184 is applied to a network analyzer or receiver 186 that, inter alia, enables correlations between spectral lines found at the various frequencies to target molecule spectral lines, whereupon signals representative of the presence of the target molecule may be applied to an alarm 188.

Thus, whether or not stepped frequencies are utilized, or whether a number of parallel-connected frequency sources are utilized, the result of being able to scan spectral lines of target and non-target molecules can be quickly scanned.

Improved Calibration, Noise Cancellation, and Cross Correlation System

Figure 11:
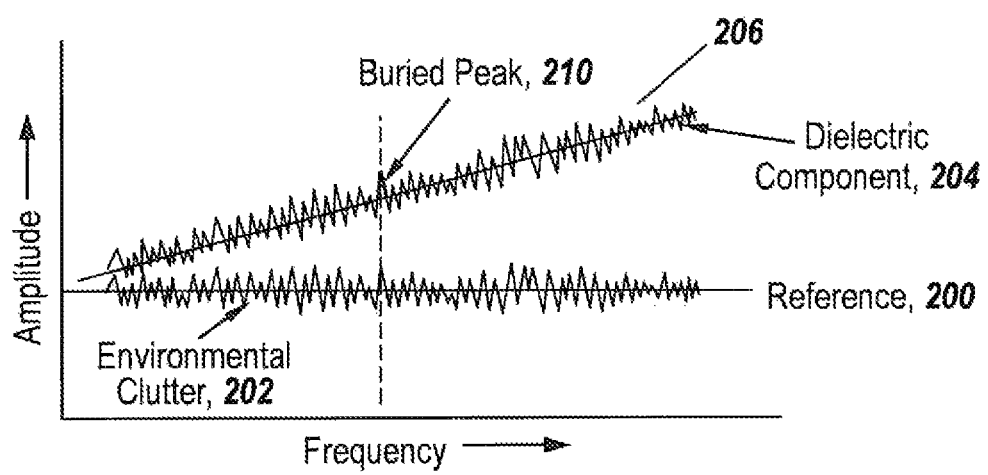
FIG. 11 is a graph showing an environmentally cluttered reference and the effect of a dielectric surrounding a particular molecule, showing a change in phase and amplitude due to the dielectric material.

Referring now to the graph of FIG. 11 in which amplitude is graphed against frequency, in order to provide for cancellation of clutter it is important to be able to exercise the basic NQR system described above by measuring the response of the system in which there is no target molecule within, for instance, the balanced and terminated transmission line. The basic NQR system is utilized to develop a reference 200 which is to be used to characterize the system absent target molecules. This reference includes environmental clutter 202.

As discussed above it is the purpose of the subject invention to be able to take the raw data coming in and subtract out the reference in order to provide a robust, highly visible indication of spectral peaks or lines due to stimulated emission. However, as shown in FIG. 11 there is usually a complex dielectric component 204 associated with materials that surround the molecules of interest, be this material human body material or other types of material. All of this material tends to offset reference 200 as illustrated by offset line 206, in part due to its dielectric constant. What this means is that whether the target molecules are embedded in a body or embedded in other materials such as a box, there is inherently a complex dielectric component of the stimulated emission. In general this can be seen by the offset line 206 that in general reflects a higher amplitude than when a complex dielectric component is not in the vicinity. This means that if one is to use standard cancellation techniques one would have to take into account the increase in amplitude, if not the difference in shape of the reference signals.

The purpose of the subject system is to be able to detect a buried peak 210 which would exist due to the stimulated emission of target molecules. But, as indicated above, this buried peak may be 70 to 80 dB below the −10 dB noise level of the entire system. Thus it is only with difficulty that one can identify such a miniscule buried peak. If one were simply to subtract the detected signal including a stimulated emission response from the reference, then one would not be canceling out environmental clutter due to the fact of the different amplitude of the clutter as viewed without a complex dielectric component and clutter with the complex dielectric imposed.

The linear functions in FIG. 11, namely the signal line 206 and the reference line 200 are derived using linear regression. The signal raw data and the reference raw data are subtracted from their respective reference lines and are shown as functions in a new coordinate system centered on zero. This will be shown in FIG. 12. As will be described, the transformed reference raw data and the transformed signal raw data are then subtracted from each to cancel clutter/noise and dielectric effects. In one embodiment, the raw reference and raw signal data are typically 0.1 milliwatts and are captured by 16 bit A/D converters in the system. This is enough dynamic range to detect the buried signal peak 210, which is typically 70 to 80 dB down from the raw data, after the reference/signal subtraction operation.

Figure 12A:
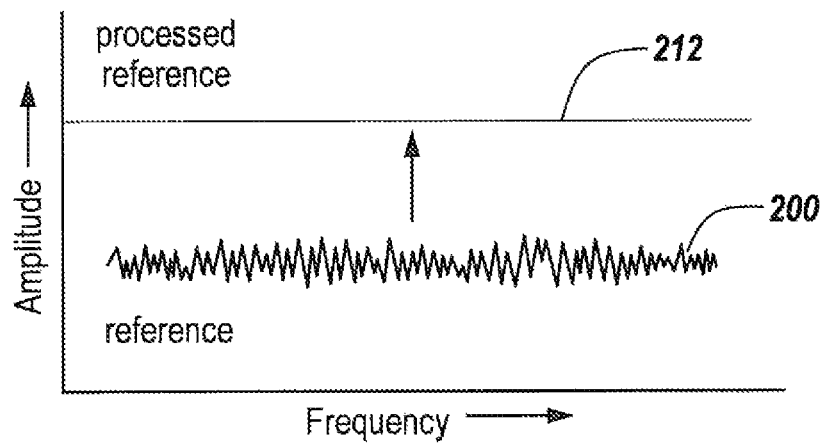
FIGS. 12A-E are a series of graphs in which a linear regression in the form of a least squares fit is applied to the reference signal of FIG. 11 to derive a least squares fit representation of the reference signal centered about zero, with the linear regression of the reference signal being used with a linear regression of stimulated emission raw data, the difference between which providing clutter cancellation and the enhancing of a spectral line peak.
Figure 12B:
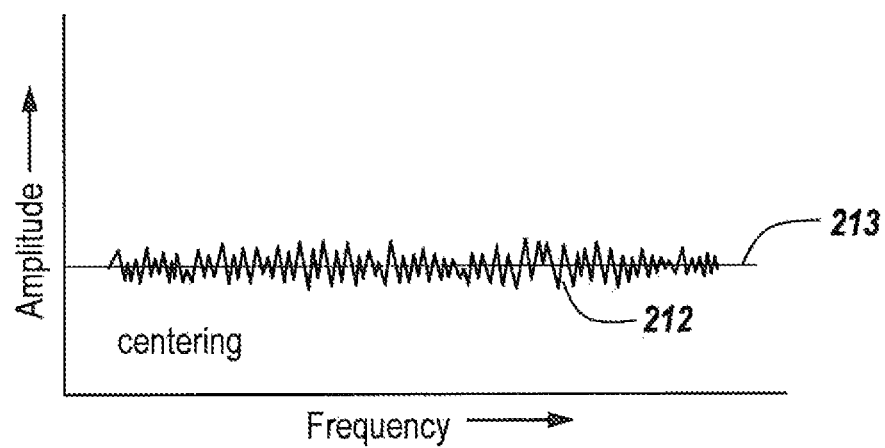

How one can eliminate clutter and thus achieve better cancellation is described in connection with FIGS. 12A-12E. What will be described in connection with FIG. 12 is the operation of a linear regression module to be described hereinafter. As can be seen from FIG. 12A, the graph shows a reference 200 which is processed utilizing for instance a least squares fit to provide a least squares fit straight line processed reference 212. Referring to FIG. 12B, reference signal 200 has subtracted from it the least squares fit straight line processed reference 212 so as to provide the reference signal centered about a zero reference level 213.

Figure 12C:
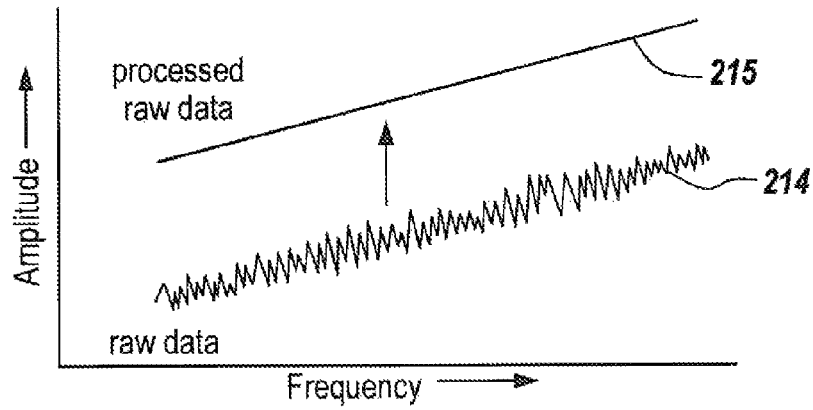

Likewise for the raw data corresponding to the stimulated emission response and referring now to FIG. 12C, what can be seen is that the stimulated emission raw data 214 when processed using the least squares fit results in a straight line processed raw data signal 215.

Figure 12D:
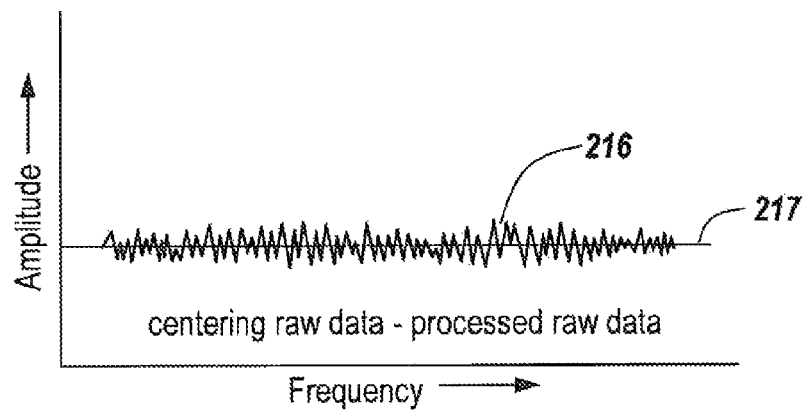

As can be seen in FIG. 12D, the stimulated emission raw data has subtracted from it the processed raw data signal, thereby to center the raw data signal 216 about a zero reference level 217.

Figure 12E:
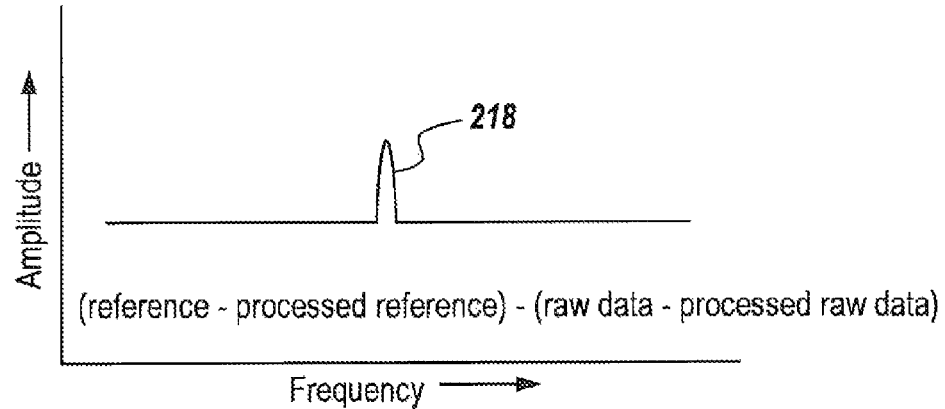

It is the linear regression technique described above which results in zero line centered reference signals and raw data signals which can be subtracted one from the other as shown in FIG. 12E to provide a highly visible spike indication 218 which is the result of the reference minus the processed reference from which is subtracted raw data signal minus the processed raw data signal.

It is the signal shown in 12E which is decluttered and normalized to the reference so as to be able to detect a spectral line spike that is some 70 to 80 dB down.

The result of the least squares fit processing of the reference signal is a normalizing of the reference signal such that excursions due to clutter are diminished and such that the excursions that do occur are centered about a zero reference level. This zero reference level establishes a reference level from which signals related to stimulated emission raw data can be subtracted.

What has been provided by the linear regression processing of the reference is that when stimulated emission raw data arrives and linear regression processing is applied, then the processed and subtracted raw data may be readily subtracted from the processed and subtracted reference, with both the reference and the raw data being processed through the linear regression technique. What this means is that the raw data will be broken down into a best approximation to a linear line and compared with the linear line best approximation of the reference data. When these two processed signals are subtracted one from the other, what is left is a single spike relating to the spectral line associated with the stimulated emission.

More particularly, as to the linear regressions, the linear regressions are formed by taking the S21 output of the network analyzer for the target molecule raw data and also the S21 output for the reference.

One then obtains a processed reference which is the magnitude of the reference raw data subtracted from the straight line reference raw data fit. This is defined as the linear regression of the reference.

As to the raw data for the target molecule, one also obtains processed target molecule raw data. This is accomplished by a linear regression process in which the magnitude of the target molecule raw data is subtracted from the target molecule straight line raw data fit. This is defined as linear regression of the target molecule raw data.

The linear regression process thus results in a clutter reduced reference and clutter-reduced target molecule stimulated emission response. One can then take the clutter-reduced target molecule data and subtract from it the clutter-reduced reference to yield a clutter-free spectrum for the target molecule.

Thus by utilizing linear regression in any of its forms and most particularly in terms of a least squares fit technique, it can be seen that the reference signal is brought down to its minimum characteristics with all extraneous amplitude excursions eliminated. Secondly, by linear regression processing of raw data, this data too is smoothed and permits the accurate subtraction of the reference from the raw data to reveal the peak.

Figure 13:
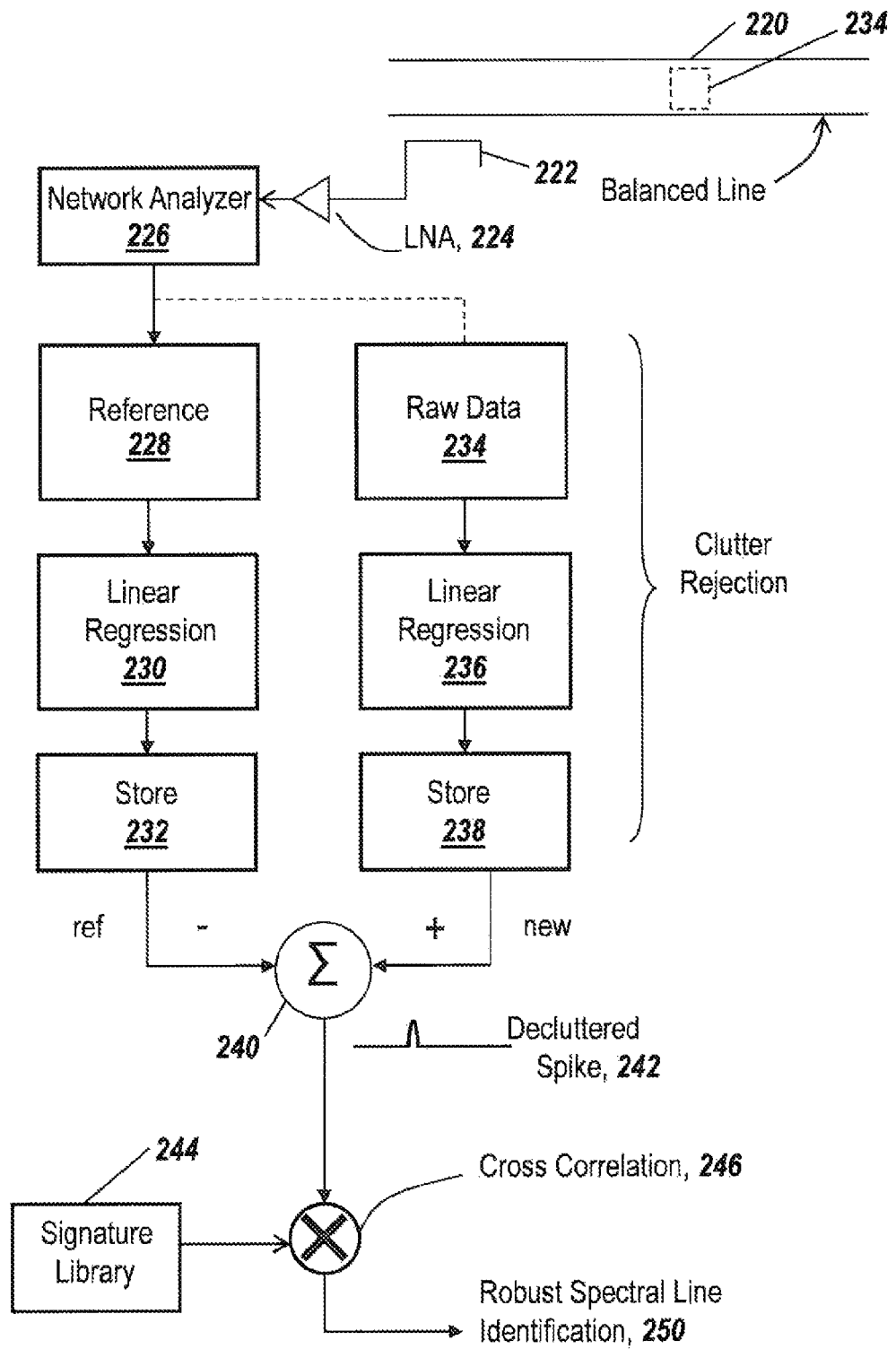
FIG. 13 is a block diagram of the subject clutter cancellation and cross correlation system for use in the nuclear quadrupole resonance system of FIG. 4, illustrating the application of linear regression to both a reference signal obtained during calibration and data obtained after calibration such that the linear regression of the reference can be subtracted from the linear regression of the stimulated emission raw data to provide a decluttered spike, followed by cross correlation with a signature library.

Referring to FIG. 13 assuming a terminated balanced line 220 and a directional coupler 222 coupled to a low noise amplifier 224 coupled to a network analyzer 226, then during the calibration process when there is no material within the balanced transmission line a reference signal is derived, here shown at 228. To this is applied linear regression as illustrated at linear regression module 230. This linear regression is accomplished by first taking the raw data performing a least squares fit, followed by subtracting the raw data from the least squares fit. The result is centered around zero so that down stream subtractions will be perfect. The result of the linear regression is stored at 232. When target molecules such as illustrated at 234 exist within the confines of the balanced transmission line, this raw data 234 is accumulated, with the results being coupled to a linear regression module 236, the output of which is stored at 238. This linear regression module functions similarly to linear regression module 230 in that the raw data is processed and the raw data is then subtracted from the processed data. As illustrated at 240 the subtraction of the outputs of molecules 230 and 236 takes place to cancel the effects of the environment from the system. The result at the output of subtraction 240 is a decluttered peak 242 which is used in the aforementioned cross correlation process to uniquely identify the spectra from the material in the samples that one is trying to ascertain the identity of.

As discussed above, a signature library 244 carries a virtual plethora of signatures of molecules of interest such that when the output from the signature library is cross correlated as illustrated at 246 with the decluttered spikes 242, an exceptionally robust spectral line identification 250 can be achieved.

What is done by the clutter cancellation and cross correlation is to provide an exceptionally robust system for detecting the miniscule stimulated emission response from target molecules that are within the balanced transmission line.

Figure 14:
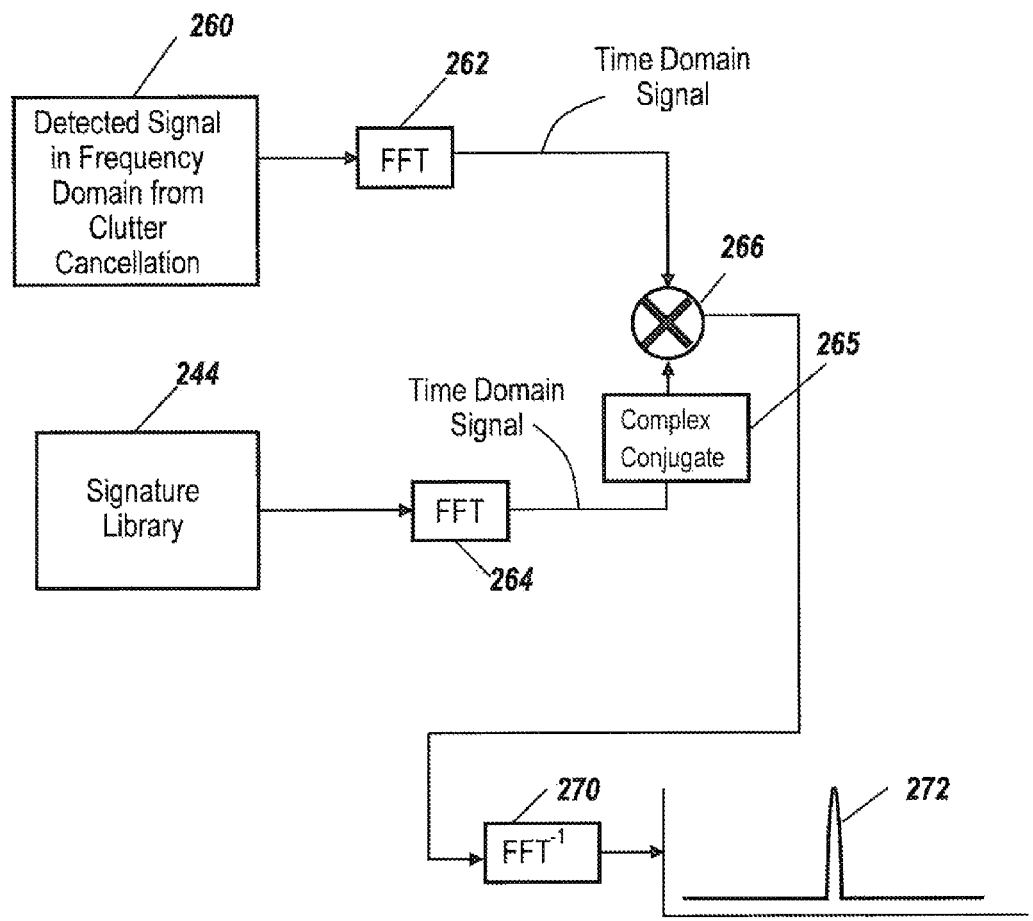
FIG. 14 is a block diagram of the cross correlation processing of FIG. 13 in which the detected signal in the frequency domain after clutter cancellation is applied to a fast Fourier transform to provide a time domain signal, with signatures in the frequency domain from a signatures library applied to a fast Fourier transform to provide the library signatures in the time domain, with the time domain library signatures having their complex conjugates computed, with the resultant time domain signatures cross correlated, and with the cross correlation transformed back into the frequency domain to provide a unique indication of the existence of a spectral line of a target molecule.

Referring now to FIG. 14, in one embodiment, the cross correlation is accomplished as follows. Decluttered spike 242 as illustrated in FIG. 13 is made available in the frequency domain as illustrated at 260. This signal is converted to the time domain by a fast Fourier transform 262. On the other hand, signature library 244 with signatures in the frequency domain has its outputs converted to the time domain by a fast Fourier transform 264, the output of which is coupled to a module 265 that outputs the complex conjugate. With both the detected signal and the signatures in the signature library in the time domain, cross correlation at 266 provides cross correlation products in the time domain as well.

The cross correlation products in the time domain are applied to an inverse FFT 270, the result of which is the identification of a spectral line or spike 272 with a high degree of reliability due to the increased signal-to-noise ratio due to the cross correlation.

Thus even in very noisy environments the essential character of the reference and the stimulated emission response can be ascertained through the subject decluttering process, followed by cross correlation to determine with relative certainty and with a low false alarm rate the presence of a particular spectral line.

Figure 15:
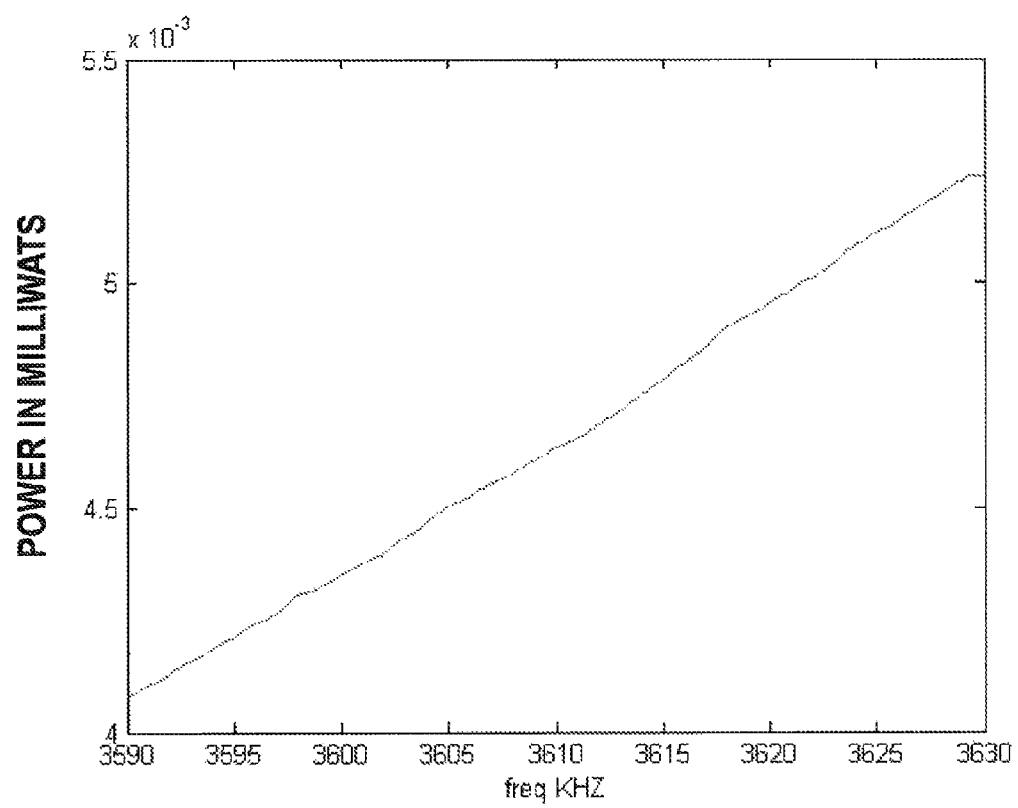
FIG. 15 is a graph of power versus frequency for raw data collected by the subject NQR system for sensing sodium nitrite as a target molecule within the balanced terminated transmission line in which the target molecule has a spectral line at 3610 KHz.

Referring now to FIGS. 15-19, what is shown is an example of NQR processing using the sodium nitrite spectrum located at 3610 KHz. In FIG. 15 what is shown is a graph of power versus frequency for the raw data obtained from the system's network analyzer in terms of the S21 output from the analyzer. Here there is no discernable spectral line due to clutter.

Figure 16:
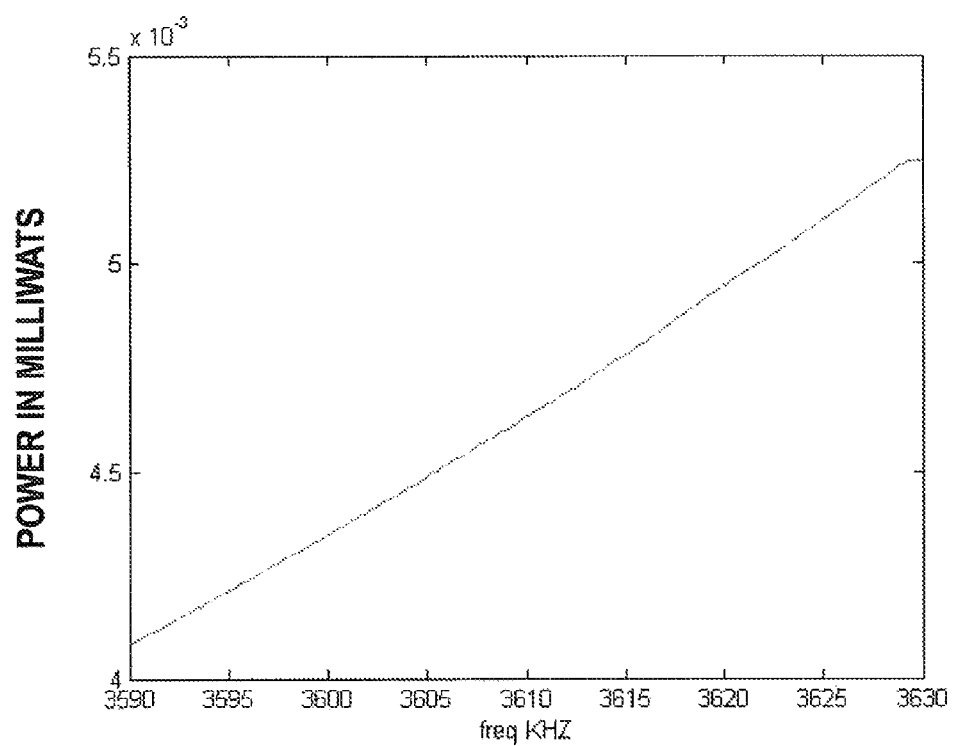
FIG. 16 a graph of power versus frequency of the S21 output of the subject NQR system in which no target molecules are located within the balanced terminated transmission line.

Referring to FIG. 16, with no target molecules in the terminated balanced transmission line one obtains an S21 output corresponding to raw data that serves as a reference, with the raw data being the S21 output of the system's network analyzer.

Figure 17:
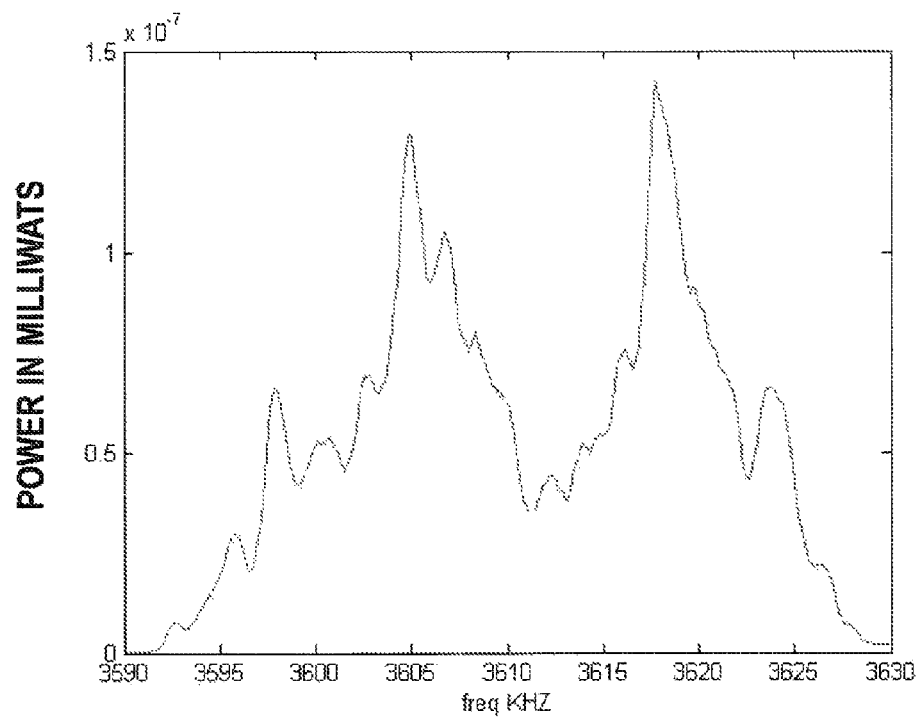
FIG. 17 is a graph of power versus frequency of the S21 output of the subject NQR system when processing sodium nitrite, indicating that the processed sodium nitrite raw data corresponds to the magnitude of the sodium nitrite raw data subtracted from the straight line raw data fit.

Referring to FIG. 17, what is shown is a graph of the processed sodium nitrite output derived as the magnitude of the sodium nitrite raw data subtracted from the straight line sodium nitrite raw data fit. Note, no reference data is used. However, there are discernable peaks for the sodium nitrite spectrum.

Figure 18:
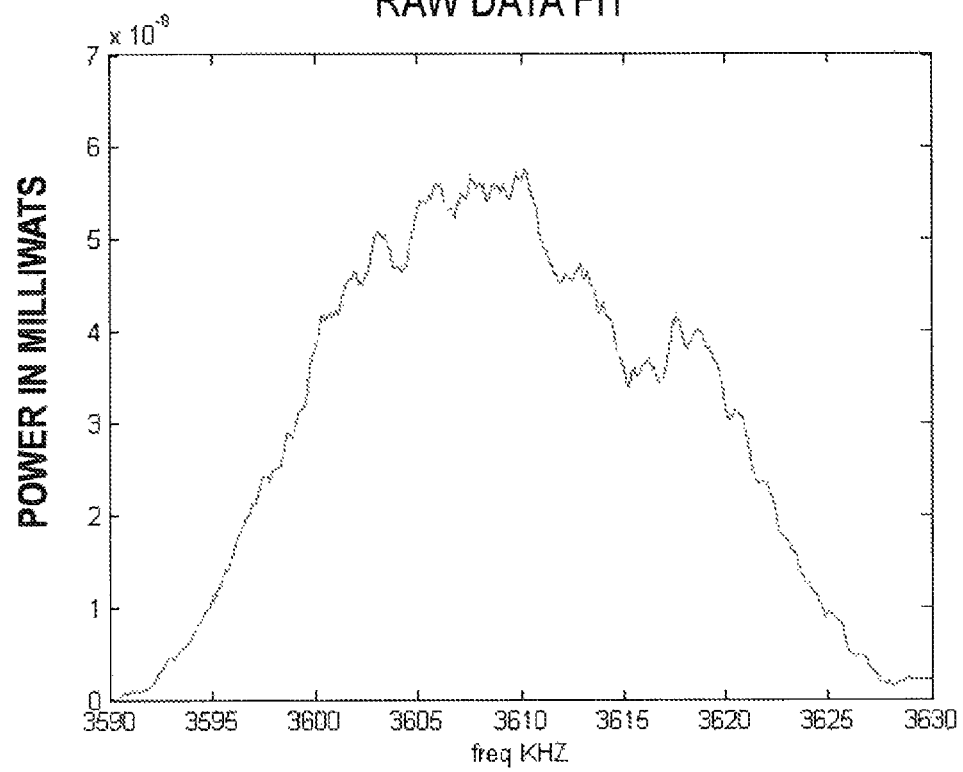
FIG. 18 is a graph of power versus frequency of the S21 output of the subject NQR system for processing a reference indicating that the processed reference corresponds to the magnitude of the reference subtracted from a reference line raw data fit; and, FIG. 19 is a graph of power versus frequency of the S21 output of the subject NQR system in which sodium nitrite is detected by subtracting the processed reference from the processed sodium nitrite raw data, indicating clear spectral peaks devoid of clutter.

Referring to FIG. 18, what is shown is the processed reference in which the magnitude of the reference raw data is subtracted from the straight line reference data fit.

Figure 19:
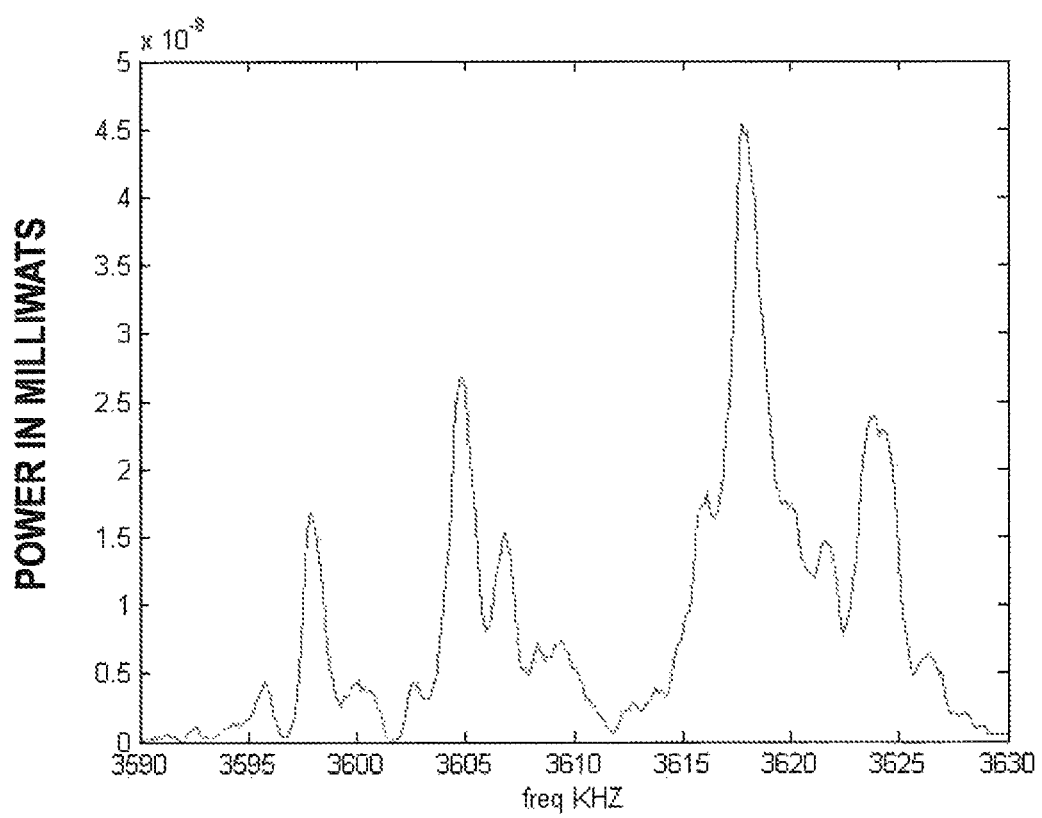

Having the processed reference, and referring now to FIG. 19, the distinct sodium nitrite NQR spectrum is derived by subtracting the processed reference from the processed sodium nitrite, the result being a distinct noise free spectrum having very discernable peaks or spectral lines and having a signal-to-noise ratio exceeding 10 dB.

While the present invention has been described in connection with the preferred embodiments of the various figures, it is to be understood that other similar embodiments may be used or modifications or additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. In a system using a signal generator for injecting energy corresponding to a spectral line of a target molecule in which the stimulated emission response from any target molecules at a given location is detected utilizing a network analyzer to derive a ratio between the injected energy and the stimulated emission response energy in terms of an S21 output signal, a method for the detection and identification of target molecules utilizing nuclear quadrupole resonance, comprising the steps of:

calibrating the system by detecting the S21 output signal from the network analyzer in the absence of a target molecule at the location, thus to provide a reference data response;

performing a linear regression on the reference data response;

injecting the energy corresponding to a spectral line of the target molecule using an untuned balanced terminated zero Q parallel conductor transmission line at the location to ascertain if any target molecules exist at the location;

utilizing the network analyzer to detect the stimulated emission response from a target molecule that exists at the location as a result of the injection of the energy;

performing a linear regression on the S21 output signal from the network analyzer containing a stimulated emission response; and, subtracting the linear regression of the stimulated emission response from the linear regression of the reference to provide a decluttered spectral line.

2. The method of claim 1, and further including the step of frequency sweeping the energy injected at the location such that the result of having no target molecule minus the result of having a target molecule results in a recognizable linear regression signature, and cross correlating the linear regression signature with a signature from a library.

3. The method of claim 1, wherein the terminated balanced line has spaced apart elements, and wherein a target molecule is located between the balanced line elements.

4. The method of claim 1, wherein the injecting step includes an antenna.

5. The method of claim 4, wherein the antenna is directional.

6. The method of claim 1, wherein the signal that is the result of the subtraction is in the frequency domain and constitutes a clutter-canceled signal, and further including the steps of converting the frequency domain clutter-canceled signal to a time domain clutter-canceled signal using a Fourier transform; providing a signature library having signals in the frequency domain; converting a frequency domain signature library signal to a time domain signal utilizing a Fourier transform; deriving the complex conjugate of the signature library time domain signal to provide a complex conjugate time domain signal; cross correlating the complex conjugate signal and clutter-canceled signal time domain signal; and, providing an inverse Fourier transform to transform the cross correlated signal in the time domain into a frequency domain signal having at least one peak corresponding to the detected stimulated emission response, thus to provide a robust indication of the existence of a target molecule.

7. The method of claim 1, wherein the steps of providing a linear regression of the reference and the stimulated emission response raw data includes storing the target molecule S21 raw data and the reference S21 data, processing the target molecule raw data by subtracting the magnitude of the target molecule raw data from a straight line raw data fit to provide processed target molecule raw data and processing the reference data by subtracting the magnitude of the reference data from the straight line reference data fit to provide processed reference data; and further including the step of subtracting the processed reference data from the processed target molecule raw data, thus to provide a robust indication of the presence of the target molecule.

8. In a nuclear quadrupole resonance target molecule detection system in which a target molecule is irradiated with energy corresponding to a spectral line thereof and in which the S21 ratio of the incident energy on the target molecule versus the stimulated emission energy from the target molecule is detected, a method for decluttering the S21 ratio, comprising the steps of:
irradiating the target molecule using an untuned balanced terminated zero Q parallel conductor transmission line;
obtaining a reference in which the target molecule is not present at a given location;
on a computer providing a linear regression of the reference to provide a straight line fit of the reference;
irradiating a target molecule utilizing an untuned balanced terminated zero Q parallel conductor transmission line so as to provide a stimulated emission response from the target molecule in terms of target molecule raw data;
on a computer performing a linear regression on the target molecule raw data;
on a computer subtracting the target molecule linear regression from the reference linear regression; and,
displaying the decluttered result to present an uncluttered stimulated transmission line.

9. A system for detection and identification of target molecules utilizing nuclear quadrupole resonance, comprising:
an untuned terminated balanced transmission line having parallel conductors and a zero Q;
a network analyzer coupled to said transmission line for driving said balanced transmission line with a signal having a frequency equal to the expected frequency of a spectral line of said target molecule;
a directional coupler for detecting stimulated emissions from a target molecule within the transmission line, said directional coupler coupled to said network analyzer, said network analyzer providing as an output thereof an S21 signal;
a number of linear regression modules coupled to the output of said network analyzer for providing linear regressions of S21 signals from said network analyzer;
a reference corresponding to the output of said network analyzer when there is no target molecule within said transmission line;
stimulated emission raw data obtained as an output of said network analyzer when said target molecule is within said balanced transmission line;
one of said linear regression modules processing the signal from said network analyzer corresponding to a reference level from said transmission line absent a target molecule therein;
a second one of said linear regression modules providing the output of said network analyzer corresponding to stimulated emission raw data that is the result of a target molecule within said balanced transmission line;
a summation node coupled to the outputs of said linear regression modules to subtract one output from the other;
a cross correlator having one output coupled to the output of said summation node;
a library of summations having an output coupled to another input to said cross correlator; and,
a display coupled to the output of said cross correlator for robust spectral line display.

10. The system of claim 9, wherein said linear regression module includes a subtraction module for subtracting the raw data to said linear regression module from a linear approximation of the input data, thus to provide a signal centered about a zero reference line.

11. The system of claim 10, wherein said summation node in each of said linear regression module subtracts the results of one subtraction from the other in said linear regression modules to provide a clutter-canceled signal corresponding to a decluttered spectral line.

12. The system of claim 11, and further including a module for converting the frequency domain clutter-canceled signal into a time domain signal prior to coupling the clutter-canceled signal to said cross correlator, a module for converting the frequency domain signatures from said signature library into time domain signals and for coupling the converted time domain signature library signals to said cross correlator; and a module for converting the time domain output signals from said cross correlator into a frequency domain signal, the frequency domain signal providing the uncluttered spectral line.

13. The system of claim 12, wherein said module for converting frequency signals to time domain signals includes a fast Fourier transform.

14. The system of claim 12, wherein said module for converting the time domain output signals from said cross correlator includes an inverse fast Fourier transform.

15. In a system using a signal generator for injecting energy corresponding to a spectral line of a target molecule in which the stimulated emission response from any target molecules at a given location is detected utilizing a network analyzer to derive a ratio between the injected energy and the stimulated emission response energy in terms of an S21 output signal, a system for the detection and identification of target molecules utilizing nuclear quadrupole resonance, comprising:
a calibrator for calibrating the system by detecting the S21 output signal from the network analyzer in the absence of a target molecule at the location, thus to provide a reference data response;
a linear regression module for performing a linear regression on the reference data response;
a signal generator and an untuned balanced terminated zero Q parallel conductor transmission line for injecting the energy corresponding to a spectral line of the target molecule at the location to ascertain if any target molecules exist at the location;

said network analyzer detecting the stimulated emission response from a target molecule that exists at the location as a result of the injection of the energy;

a linear regression module for performing a linear regression on the S21 output signal from said network analyzer containing a stimulated emission response; and, a subtraction module for subtracting the linear regression of the stimulated emission response from the linear regression of the reference to provide a decluttered spectral line.

16. The system of claim 15, wherein said signal generator sweeps the energy injected at the location such that the result of having no target molecule minus the result of having a target molecule results in a recognizable linear regression signature, and further including a cross correlator for cross correlating the linear regression signature with a signature from a signature library.

17. The system of claim 15, and further including a terminated balanced transmission line having spaced apart elements coupled to said signal generator, and wherein a target molecule is located between the balanced line elements.

18. The system of claim 15, and further including an antenna coupled to said signal generator.

19. The system of claim 18, wherein said antenna is directional.

* * * * *